(12) United States Patent
Chang et al.

(10) Patent No.: US 11,302,663 B2
(45) Date of Patent: Apr. 12, 2022

(54) FILM SCHEME FOR BUMPING

(71) Applicant: Taiwan Semiconductor Manufacturing Co., Ltd., Hsin-Chu (TW)

(72) Inventors: Yao-Wen Chang, Taipei (TW); Chern-Yow Hsu, Chu-Bei (TW); Cheng-Yuan Tsai, Chu-Pei (TW); Kong-Beng Thei, Pao-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/851,245

(22) Filed: Apr. 17, 2020

(65) Prior Publication Data
US 2020/0243469 A1    Jul. 30, 2020

Related U.S. Application Data

(63) Continuation of application No. 15/711,045, filed on Sep. 21, 2017, now Pat. No. 10,658,318.
(Continued)

(51) Int. Cl.
   *H01L 23/00*   (2006.01)
   *H01L 21/288*  (2006.01)
   *H01L 21/311*  (2006.01)

(52) U.S. Cl.
   CPC ............ *H01L 24/13* (2013.01); *H01L 21/288* (2013.01); *H01L 21/31116* (2013.01);
   (Continued)

(58) Field of Classification Search
   CPC . H01L 2224/13; H01L 2224/05; H01L 24/04; H01L 24/11
   See application file for complete search history.

(56) References Cited

U.S. PATENT DOCUMENTS 5,310,699 A    5/1994  Chikawa et al.
10,026,649 B2  7/2018  Shusterman et al.
(Continued)

FOREIGN PATENT DOCUMENTS

JP    H09186190 A    7/1997
JP    2006310426 A   11/2006

OTHER PUBLICATIONS

Zhengshan J. Yu, et al.; "Silicon Wafers with Optically Specular Surfaces Formed by Chemical Polishing", College of Optical Sciences, University of Arizona, Tucson, Oct. 1, 2016.
(Continued)

*Primary Examiner* — Sarah K Salerno
(74) *Attorney, Agent, or Firm* — Eschweiler & Potashnik, LLC

(57) ABSTRACT

A bump structure with a barrier layer, and a method for manufacturing the bump structure, are provided. In some embodiments, the bump structure comprises a conductive pad, a conductive bump, and a barrier layer. The conductive pad comprises a pad material. The conductive bump overlies the conductive pad, and comprises a lower bump layer and an upper bump layer covering the lower bump layer. The barrier layer is configured to block movement of the pad material from the conductive pad to the upper bump layer along sidewalls of the lower bump layer. In some embodiments, the barrier layer is a spacer lining the sidewalls of the lower bump layer. In other embodiments, the barrier layer is between the barrier layer and the conductive pad, and spaces the sidewalls of the lower bump layer from the conductive pad.

20 Claims, 19 Drawing Sheets

Related U.S. Application Data

(60) Provisional application No. 62/427,197, filed on Nov. 29, 2016.

(52) U.S. Cl.
CPC ............ H01L 24/03 (2013.01); H01L 24/05 (2013.01); H01L 24/11 (2013.01); *H01L 2224/02175* (2013.01); *H01L 2224/0345* (2013.01); *H01L 2224/0391* (2013.01); *H01L 2224/03452* (2013.01); *H01L 2224/0401* (2013.01); *H01L 2224/05018* (2013.01); *H01L 2224/05022* (2013.01); *H01L 2224/05082* (2013.01); *H01L 2224/05124* (2013.01); *H01L 2224/05147* (2013.01); *H01L 2224/05166* (2013.01); *H01L 2224/05186* (2013.01); *H01L 2224/05567* (2013.01); *H01L 2224/05573* (2013.01); *H01L 2224/05624* (2013.01); *H01L 2224/05647* (2013.01); *H01L 2224/05666* (2013.01); *H01L 2224/05681* (2013.01); *H01L 2224/10145* (2013.01); *H01L 2224/1145* (2013.01); *H01L 2224/11424* (2013.01); *H01L 2224/11452* (2013.01); *H01L 2224/11462* (2013.01); *H01L 2224/11464* (2013.01); *H01L 2224/1301* (2013.01); *H01L 2224/13013* (2013.01); *H01L 2224/13014* (2013.01); *H01L 2224/13017* (2013.01); *H01L 2224/13021* (2013.01); *H01L 2224/13078* (2013.01); *H01L 2224/13083* (2013.01); *H01L 2224/13144* (2013.01); *H01L 2224/13155* (2013.01); *H01L 2224/13157* (2013.01); *H01L 2224/13166* (2013.01); *H01L 2224/13169* (2013.01); *H01L 2224/13173* (2013.01); *H01L 2224/13176* (2013.01); *H01L 2224/13178* (2013.01); *H01L 2224/13186* (2013.01); *H01L 2924/01022* (2013.01); *H01L 2924/01027* (2013.01); *H01L 2924/01073* (2013.01); *H01L 2924/04941* (2013.01); *H01L 2924/04953* (2013.01)

(56) References Cited

U.S. PATENT DOCUMENTS

| | | | |
|---|---|---|---|
| 2006/0017160 A1 | 1/2006 | Huang | |
| 2007/0117343 A1* | 5/2007 | Hwang | H01L 24/03 |
| | | | 438/401 |
| 2008/0001290 A1 | 1/2008 | Chou et al. | |
| 2009/0166804 A1 | 7/2009 | Gardner et al. | |
| 2011/0089572 A1 | 4/2011 | Tezcan et al. | |
| 2013/0075905 A1* | 3/2013 | Choi | H01L 25/0657 |
| | | | 257/738 |
| 2013/0127045 A1 | 5/2013 | Lin et al. | |
| 2013/0166804 A1 | 6/2013 | Nishitani et al. | |
| 2013/0334529 A1 | 12/2013 | Kaneko et al. | |
| 2015/0001712 A1 | 1/2015 | Daubenspeck | |
| 2015/0262953 A1* | 9/2015 | Lee | H01L 24/11 |
| | | | 257/737 |
| 2015/0318333 A1 | 11/2015 | Narayanan et al. | |
| 2016/0190062 A1 | 6/2016 | Zheng et al. | |
| 2016/0233182 A1 | 8/2016 | Hu | |

OTHER PUBLICATIONS

Non-Final Office Action dated Jun. 26, 2019 for U.S. Appl. No. 15/711,045.

Final Office Action dated Nov. 7, 2019 for U.S. Appl. No. 15/711,045.

Notice of Allowance dated Jan. 16, 2020 for U.S. Appl. No. 15/711,045.

* cited by examiner

FILM SCHEME FOR BUMPING

REFERENCE TO RELATED APPLICATIONS

This Application is a Continuation of U.S. application Ser. No. 15/711,045, filed on Sep. 21, 2017, which claims the benefit of U.S. Provisional Application No. 62/427,197, filed on Nov. 29, 2016. The contents of the above-referenced Patent Applications are hereby incorporated by reference in their entirety.

BACKGROUND

During the bulk manufacture of an integrated circuit (IC), a plurality of IC dies are formed on a semiconductor substrate. After forming the IC dies, the IC dies are separated and packaged. Wafer-level packaging (WLP) is a packaging process in which the IC dies are packaged before separation. Some types of WLP may use nickel/gold (Ni/Au) bumping. Such types of WLP may include, for example, flip chip packaging or a chip-scale packaging (CSP). Ni/Au bumping is a process in which Ni/Au bumps are formed across front sides of the IC dies. Ni/Au bumping finds application in the packaging of IC dies with high voltage display drivers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
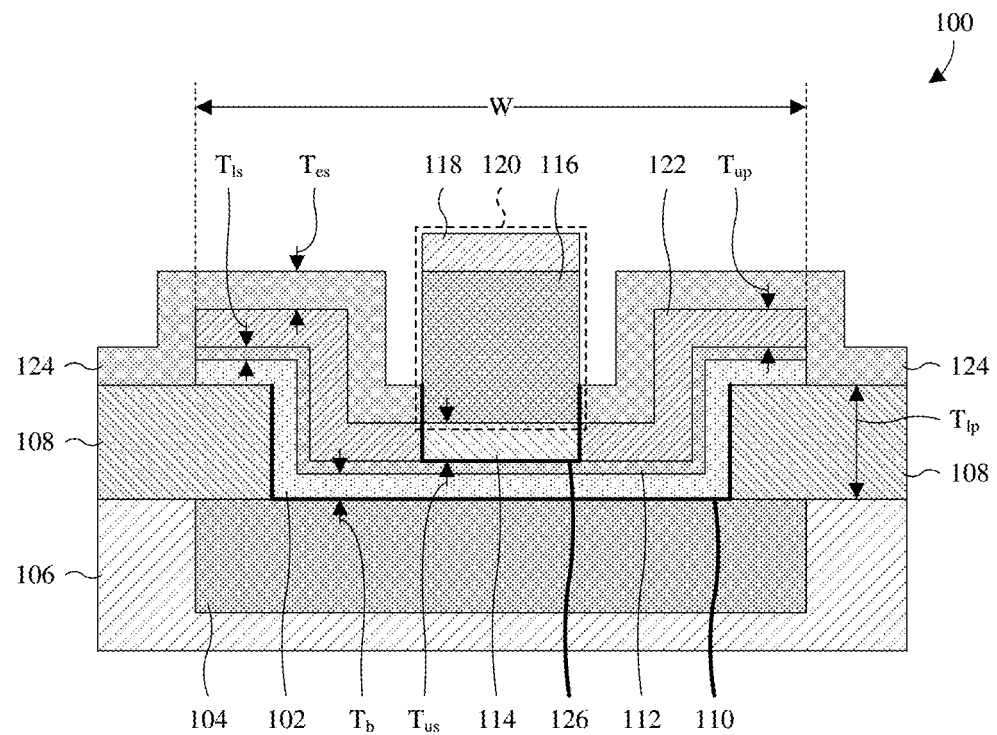
FIG. 1 illustrates a cross-sectional view of some embodiments of a bump structure with a barrier layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to some packaging processes using nickel/gold (Ni/Au) bumping, a first passivation layer is formed covering a copper pad, and a second passivation layer is formed covering the first passivation layer. A first etch is performed into the second passivation layer. The first etch stops on the first passivation layer and forms a first opening overlying the copper pad. An etch stop layer is formed covering the first and second passivation layers and lining the first opening. Further, a sacrificial layer is formed covering the etch stop layer and filling the first opening. A planarization is performed into a top of the sacrificial layer, and a second etch is performed into the sacrificial layer, the etch stop layer, and the first passivation layer. The second etch forms a second opening that exposes the copper pad and that is laterally spaced between sidewalls of the first opening. A Ni/Au bump is formed in the second opening, and the sacrificial layer is subsequently removed. The Ni/Au bump comprises a nickel layer on the copper pad, and a gold layer capping the nickel layer A challenge with the packaging processes is that copper from the copper pad may diffuse to the gold layer along gaps between sidewalls of the nickel layer and sidewalls of the sacrificial layer. The gaps may, for example, form due to a low phosphorus concentration in the nickel layer, which is a byproduct of an electroless nickel plating used to form the nickel layer. Further, the diffusion may, for example, be driven by high temperature processes performed between formation of the Ni/Au bump and removal of the sacrificial layer. Such high temperature processes may, for example, include processes performed at temperatures greater than about 400 degrees Celsius. Contamination of the gold layer increases contact resistance of the Ni/Au bump and/or lowers bondability of the Ni/Au bump to benzocyclobutene (BCB). BCB may, for example, be used to bond a substrate (e.g., a wafer) to an integrated circuit (IC) incorporating the Ni/Au bump. Accordingly, contamination of the gold layer may lead to low yields during bulk manufacture and packaging of an IC using the packaging processes.

In view of the foregoing, various embodiments of the present application are directed towards a bump structure with a barrier layer, as well as a method for manufacturing the bump structure. In some embodiments, the bump structure comprises a conductive pad, a conductive bump, and a barrier layer. The conductive pad comprises a pad material. The conductive bump overlies the conductive pad, and comprises a lower bump layer and an upper bump layer covering the lower bump layer. The barrier layer is configured to block movement of the pad material from the conductive pad to the upper bump layer along sidewalls of the lower bump layer. In some embodiments, the barrier layer is a spacer lining the sidewalls of the lower bump layer. In other embodiments, the barrier layer is between the barrier layer and the conductive pad, and spaces the sidewalls of the lower bump layer from the conductive pad.

The barrier layer blocks or otherwise slows movement (e.g., diffusion) of the pad material to the upper bump layer along the sidewalls of the lower bump layer. This prevents the pad material from contaminating the upper bump layer, such that contact resistance of the upper bump layer is low and bondability of the upper bump layer to BCB is high. Accordingly, yields may be high during bulk manufacture and packaging of ICs incorporating the bond structure.

With reference to FIG. 1, a cross-sectional view 100 of some embodiments of a bump structure with a barrier layer 102 is provided. As illustrated, a pad 104 is conductive and recessed into a top of a dielectric layer 106, such that a top surface of the pad 104 is even with a top surface of the dielectric layer 106. Further, a lower passivation layer 108 overlies the dielectric layer 106 and the pad 104. The lower passivation layer 108 is dielectric and defines a first opening 110 overlying the pad 104.

The barrier layer 102 overlies and is electrically coupled to the pad 104. Further, the barrier layer 102 lines the first opening 110. The barrier layer 102 is conductive and blocks pad material from diffusing from the pad 104 to structure overlying the barrier layer 102. For example, the pad 104 may be or otherwise comprise pure copper or copper alloy, and the barrier layer 102 may be or otherwise comprises titanium nitride, titanium tungsten, tungsten nitride, tantalum nitride, some other barrier material for copper, or a combination of the foregoing.

A lower seed layer 112 overlies and lines the barrier layer 102. The lower seed layer 112 is conductive and facilitates the selective growth or deposition of an upper seed layer 114 during manufacture of the bump structure. For example, the lower seed layer 112 may be or otherwise comprise pure tantalum or pure titanium when the upper seed layer 114 is cobalt selectively deposited by electroless plating.

The upper seed layer 114 overlies and contacts the lower seed layer 112. The upper seed layer 114 is conductive and facilitates the formation of a lower bump layer 116 during manufacture of the bump structure. For example, the upper seed layer 114 may be cobalt and the lower bump layer 116 may be nickel selectively deposited by electroless plating.

The lower bump layer 116 overlies and contacts the upper seed layer 114. Further, the lower bump layer 116 is conductive and is covered by an upper bump layer 118. The upper bump layer 118 is conductive and more resistant to oxidation and corrosion than the lower bump layer 116 so as to protect the lower bump layer 116 from oxidation and corrosion. For example, the upper bump layer 118 may require more energy to oxidize than the lower bump layer 116. The lower and upper bump layers 116, 118 collectively define a bump 120.

The barrier layer 102 prevents pad material from the pad 104 from diffusing to the upper bump layer 118, along sidewalls of the lower bump layer 116, during manufacture of the bump structure. This, in turn, allows low contact resistance at the upper bump layer 118, high yields during bulk manufacture of the bump structure, and high bond strength when the upper bump layer 118 is bonded to a substrate (e.g., a wafer) with BCB. Additionally, the lower and upper seed layers 112, 114 facilitate the formation of the lower bump layer 116 on the barrier layer 102 using electroless plating during manufacture of the bump structure.

In some embodiments, the pad 104 is or otherwise comprises copper, aluminum, aluminum copper, some other metal, some other conductive material, or a combination of the foregoing. In some embodiments, the pad 104 is a pure metal (e.g., pure copper) or a metal alloy. In some embodiments, the dielectric layer 106 is or otherwise comprises silicon dioxide, silicon nitride, a low κ dielectric, some other dielectric, or a combination of the foregoing. As used herein, a low κ dielectric is a dielectric with a dielectric constant κ less than about 3.9, 3, 2, or 1. In some embodiments, the pad 104 is in a top metallization layer of a back-end-of-line (BEOL) metallization stack, and/or the dielectric layer 106 is an inter-layer dielectric (ILD) layer of the BEOL metallization stack.

In some embodiments, the lower passivation layer 108 is or otherwise comprises silicon dioxide, silicon nitride, silicon carbide, some other dielectric, or a combination of the foregoing. For example, the lower passivation layer 108 may comprise a silicon carbide layer, a first silicon nitride layer covering the silicon carbide layer, a first silicon dioxide layer covering the first silicon nitride layer, a second silicon nitride layer covering the first silicon dioxide layer, and a second silicon dioxide layer covering the second silicon nitride layer. Further, in some embodiments, the lower passivation layer 108 has a thickness $T_{lp}$ between about 7000-9000 angstroms, about 7500-7600 angstroms, or about 8000-9000 angstroms. For example, the thickness $T_{lp}$ of the lower passivation layer 108 may be about 7550 angstroms.

In some embodiments, the barrier layer 102 contacts the pad 104 and/or contacts sidewalls of the first opening 110. Further, in some embodiments, the barrier layer 102 overlies the lower passivation layer 108 and/or contacts a top surface of the lower passivation layer 108. In some embodiments, the barrier layer 102 is or otherwise comprises titanium nitride, titanium tungsten, tungsten nitride, tantalum nitride, some other barrier material, or a combination of the foregoing. In some embodiments, the barrier layer 102 and the pad 104 each comprise metal grains (e.g., crystallites), and the metal grains of the barrier layer 102 are smaller than the metal grains of the pad 104 to prevent diffusion of pad material through the barrier layer 102. In some embodiments, the barrier layer 102 has a thickness $T_b$ between about 500-700 angstroms, about 550-650 angstroms, or about 300-900 angstroms. For example, the thickness $T_b$ of the barrier layer 102 may be about 600 angstroms.

In some embodiments, the lower seed layer 112 fully covers the barrier layer 102 and/or contacts the barrier layer 102. Further, in some embodiments, the lower seed layer 112 overlies the lower passivation layer 108. In some embodiments, the lower seed layer 112 is or otherwise comprises tantalum, titanium, copper, some other seed material for a plating process, or a combination of the foregoing. In some embodiments, the lower seed layer 112 is a pure metal, such as, for example, pure tantalum or pure titanium, and/or the barrier layer 102 is tantalum nitride. In some embodiments, the lower seed layer 112 has a thickness $T_{ls}$ between about 25-75 angstroms, about 45-55 angstroms, or about 40-90 angstroms. For example, the thickness $T_{ls}$ of the lower seed layer 112 may be about 50 angstroms.

In some embodiments, an upper passivation layer 122 fully covers the lower seed layer 112 and/or contacts the lower seed layer 112. Further, in some embodiments, the upper passivation layer 122 overlies the lower passivation layer 108. In some embodiments, the upper passivation layer 122 is dielectric, and/or is or otherwise comprises silicon dioxide, silicon nitride, silicon carbide, silicon oxynitride, some other dielectric, or a combination of the foregoing. In some embodiments, the upper passivation layer 122 has a thickness $T_{up}$ between about 750-1250 angstroms, 500-1500 angstroms, or about 900-1100 angstroms. For example, the thickness $T_{up}$ of the upper passivation layer 122 may be about 1000 angstroms. Further, in some embodiments, the upper passivation layer 122, the barrier layer 102, and the lower seed layer 112 have the same width W.

In some embodiments, an etch stop layer 124 covers and lines the lower passivation layer 108 and the upper passivation layer 122. Further, in some embodiments, the etch stop layer 124 contacts the lower passivation layer 108 and/or the upper passivation layer 122. In some embodiments, the etch stop layer 124 is or otherwise comprises aluminum oxide, silicon nitride, silicon dioxide, some other dielectric, or a combination of the foregoing. In some embodiments, the etch stop layer 124 has a thickness $T_{es}$ between about 100-200 angstroms, 160-170 angstroms, or about 50-300 angstroms. For example, the thickness $T_{es}$ of the etch stop layer 124 may be about 150 angstroms.

In some embodiments, the etch stop layer 124 and/or the upper passivation layer 122 define a second opening 126 overlying the first opening 110 and the pad 104. In some embodiments, the second opening 126 is recessed into the first opening 110, and/or spaced from sidewalls of the first opening 110. In some embodiments, the upper seed layer 114 and the lower bump layer 116 are in the second opening 126. In some embodiments, the upper seed layer 114 is confined to a bottom of the second opening 126.

In some embodiments, the upper seed layer 114 contacts sidewalls of the upper passivation layer 122. In some embodiments, the upper seed layer 114 is or otherwise comprises cobalt, copper, tantalum, titanium, some other seed material, or a combination of the foregoing. Further, in some embodiments, the upper seed layer 114 is a pure metal (e.g., pure cobalt) and/or has a composition limited to metal elements. In some embodiments, the upper seed layer 114 has a thickness $T_{us}$ greater than or equal to about 95 angstroms, and/or between about 95-2000 angstroms, about 95-1000 angstroms, or about 500-1500 angstroms.

In some embodiments, the lower bump layer 116 laterally contacts sidewalls of the etch stop layer 124 and/or sidewalls of the upper passivation layer 122. In some embodiments, the lower bump layer 116 is pure nickel, nickel alloy, some other metal, some other conductive material, or a combination of the foregoing. In some embodiments, the upper bump layer 118 contacts the lower bump layer 116, and/or completely covers the lower bump layer 116. In some embodiments, the upper bump layer 118 is gold, platinum, iridium, ruthenium, rhodium, some other noble metal, some other conductive material resistant to oxidation and corrosion, or a combination of the foregoing. In some embodiments, the bump 120 defined by the lower and upper bump layers 116, 118 is vertically elongated, and/or has a cylindrical shape, a rectangular cuboid shape, or some other shape. Further, in some embodiments, the bump 120 has a rectangular profile, a profile tapering in width from top to bottom, or some other profile.

In some embodiments, the pad 104 is or otherwise comprises copper, the barrier layer 102 is or otherwise comprises tantalum nitride, the lower seed layer 112 is or otherwise comprises pure titanium or pure tantalum, the upper seed layer 114 is or otherwise comprises cobalt, the lower bump layer 116 is or otherwise comprises nickel, and the upper bump layer 118 is or otherwise comprises gold. In such embodiments, the barrier layer 102 blocks or slows the diffusion of copper from the pad 104 to the upper bump layer 118, along sidewalls of the lower bump layer 116, thereby leading to high yields during bulk manufacture of integrated circuits (ICs) incorporating the bump structure.

Figure 2A:
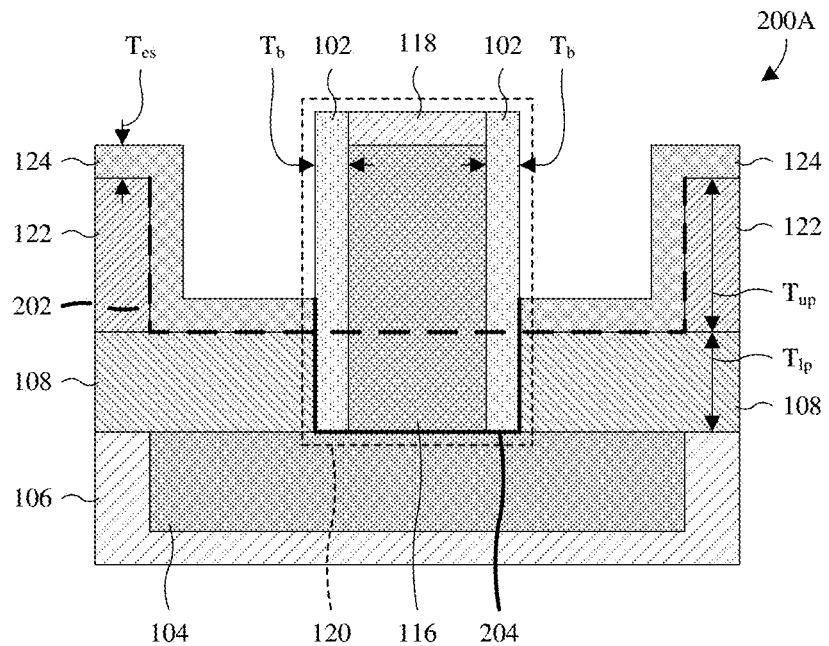
FIGS. 2A and 2B illustrate cross-sectional views of various alternative embodiments of the bump structure of FIG. 1 in which the barrier layer is a spacer.
Figure 2B:
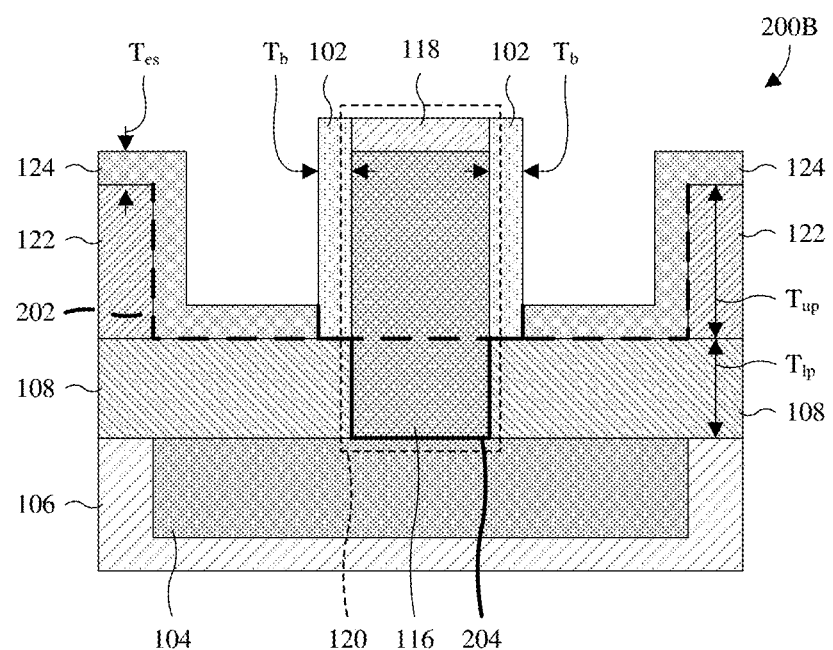

With reference to FIGS. 2A and 2B, cross-sectional views 200A, 200B of various alternative embodiments of the bump structure of FIG. 1 are provided. In the various alternative embodiments, the barrier layer 102 is a sidewall spacer lining sidewalls of the bump 120. Further, the barrier layer 102 comprises a pair of segments (not uniquely labeled) respectively lining opposite sidewalls of the bump 120. By lining the opposite sidewalls, the barrier layer 102 slows or blocks movement (e.g., diffusion) of pad material along sidewalls of the bump 120, from the pad 104 to the upper bump layer 118. This, in turn, prevents the pad material from increasing contact resistance of the upper bump layer 118 and lowering a bondability of the upper bump layer 118 to BCB. As such, yields may be high during bulk manufacture of integrated circuits incorporating the bump structure.

With reference more particularly to FIG. 2A, the upper passivation layer 122 defines a first opening 202 overlying the lower passivation layer 108 and the pad 104. In some embodiments, the upper passivation layer 122 is or otherwise comprises an oxide-nitride-oxide (ONO) film. For example, the upper passivation layer 122 may comprise a lower silicon dioxide layer, a silicon nitride layer covering the lower silicon dioxide layer, and an upper silicon dioxide layer covering the silicon nitride layer. Further, in some embodiments, the thickness $T_{up}$ of the upper passivation layer 122 is between about 5000-6000 angstroms, about 5400-5600 angstroms, or about 4000-7000 angstroms. For example, the thickness $T_{up}$ of the upper passivation layer 122 may be about 5500 angstroms.

In some embodiments, the etch stop layer 124 covers the lower and upper passivation layers 108, 122, and lines the first opening 202. Further, in some embodiments, the etch stop layer 124 contacts the lower and upper passivation layers 108, 122, and/or laterally contacts sidewalls of the first opening 202.

The lower passivation layer 108 and, in some embodiments, the etch stop layer 124 define a second opening 204 that overlies the pad 104, between the pad 104 and the first opening 202. In some embodiments, the second opening 204 is laterally spaced from sidewalls of the first opening 202. In some embodiments, the lower passivation layer 108 is or otherwise comprises a silicon carbide layer and a silicon nitride layer covering the silicon carbide layer. Further, in some embodiments, the thickness $T_{lp}$ of the lower passivation layer 108 is between about 1000-3000 angstroms, about 2000-2100 angstroms, or about 1750-2250 angstroms. For example, the thickness $T_{lp}$ of the lower passivation layer 108 may be about 2050 angstroms.

The second opening 204 accommodates the bump 120 and the barrier layer 102. In some embodiments, the lower bump layer 116 contacts the pad 104 within the second opening 204, and/or the barrier layer 102 contacts the pad 104 within the second opening 204. Further, in some embodiments, the upper bump layer 118 is spaced over the second opening 204 by the lower bump layer 116. Further yet, in some embodiments, the lower bump layer 116 is nickel, and/or the upper bump layer 118 is gold.

The barrier layer 102 comprises a pair of segments (not uniquely labeled) respectively lining opposite sides of the bump 120 to block or slow the movement (e.g., diffusion) of pad material along sidewalls of the lower bump layer 116, from the pad 104 to the upper bump layer 118. Further, the segments of the barrier layer 102 respectively have bottom surfaces even with a bottom surface of the lower bump layer 116. In some embodiments, the segments of the barrier layer 102 each have a thickness $T_b$ between about 400-700 angstroms, about 450-550 angstroms, or about 300-1000 angstroms. For example, the thickness $T_b$ of each segment of the barrier layer 102 may be about 500 angstroms. In some embodiments, the barrier layer 102 contacts sidewalls of the lower bump layer 116 and/or contacts sidewalls of the lower passivation layer 108. In some embodiments, the barrier layer 102 is or otherwise comprises titanium nitride, titanium tungsten, tungsten nitride, tantalum nitride, aluminum oxide, some other barrier material, or a combination of the foregoing.

With reference more particularly to FIG. 2B, FIG. 2B is a variant of FIG. 2A in which the barrier layer 102 overlies the lower passivation layer 108 and has a bottom surface spaced over a bottom surface of the lower bump layer 116. Further, the second opening 204 has a stepped profile and the barrier layer 102 rests on a step of the stepped profile.

Figure 3:
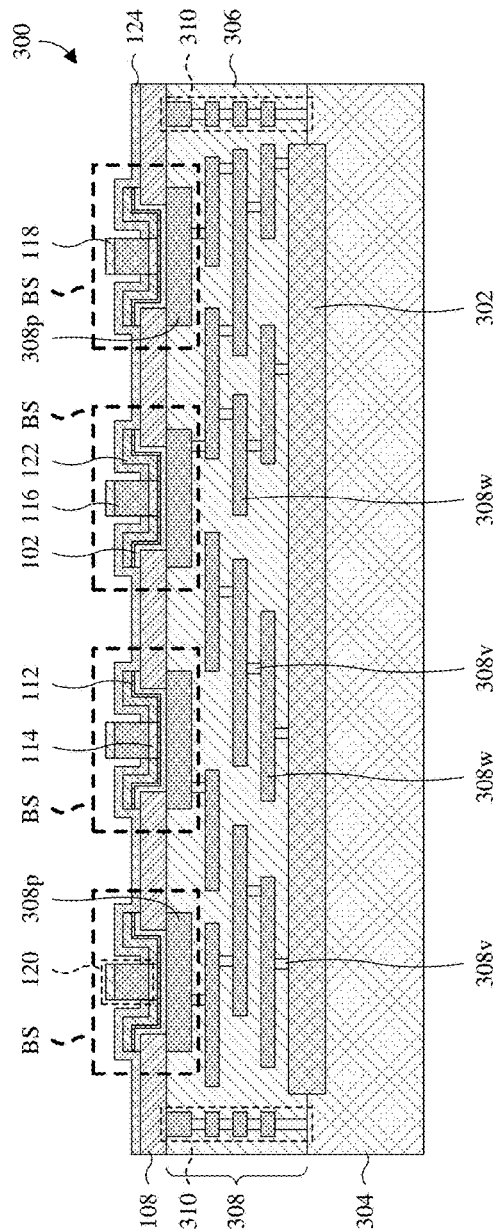
FIG. 3 illustrates a cross-sectional view of some embodiments of an integrated circuit (IC) comprising the bump structure of FIG. 1.

With reference to FIG. 3, a cross-sectional view 300 of some embodiments of an integrated circuit (IC) die including the bump structure of FIG. 1 is provided. The bump structure of FIG. 1 may, for example, repeat within boxes BS.

As illustrated, a semiconductor device layer 302 is recessed into a top of a semiconductor substrate 304. The semiconductor device layer 302 includes a plurality of semiconductor devices (not individually shown). In some embodiments, the semiconductor devices include metal-oxide-semiconductor (MOS) devices, field-effect transistors (FETs), complementary MOS (CMOS) devices, MOSFETs, insulated-gate FETs (IGFETs), laterally diffused MOS (LDMOS) transistors, other semiconductor devices, or a combination of the foregoing. Further, in some embodiments, the semiconductors devices include high voltage semiconductor devices (e.g., operating at voltages in excess of about 100, 200, 400, or 700 volts), display driver semiconductor devices, or a combination of the foregoing. The semiconductor substrate 304 may be, for example, a bulk silicon substrate, a silicon-on-insulator (SOI) substrate, a group III-V substrate, or some other type of semiconductor substrate.

An ILD layer 306 and a BEOL metallization stack 308 overlie the semiconductor substrate 304 and the semiconductor device layer 302. The ILD layer 306 accommodates the BEOL metallization stack 308 and may be or otherwise comprise, for example, silicon dioxide, silicon nitride, a low κ dielectric, some other dielectric, or a combination of the foregoing. The BEOL metallization stack 308 is electrically coupled to the semiconductor device layer 302 and the bumps 120 of the bump structures. For ease of illustration, only one of the bumps 120 is labeled 120. Further, the BEOL metallization stack 308 defines conductive paths interconnecting the semiconductor devices of the semiconductor device layer 302, and further connecting the bumps 120 to the semiconductor devices.

The BEOL metallization stack 308 comprises a plurality of conductive features, such as, for example, a plurality of vias 308v, a plurality of wires 308w, and a plurality of pads 308p. For ease of illustration, only some of the vias 308v are labeled 308v, only some of the wires 308w are labeled 308w, and only some of the pads 308p are labeled 308p. The vias 308v each extend vertically from one of the wires 308w to another one of the wires 308w, one of the pads 308p, the semiconductor device layer 302, or some other type of conductive feature. The wires 308w each extend laterally from one of the vias 308v to another one of the vias 308v. The pads 308p are at a top of the BEOL metallization stack 308 and each overlie and adjoin one of the vias 308v. The conductive features may be or otherwise comprise, for example, copper, aluminum, aluminum copper, tungsten, some other conductive material, or a combination of the foregoing. For example, the pads 308p may be or otherwise include pure copper or copper alloy.

In some embodiments, the conductive features define a seal ring structure 310 extending laterally along a periphery of the semiconductor device layer 302. In some embodiments, the seal ring structure 310 is ring shaped and/or completely encloses the semiconductor device layer 302 in a closed path. The seal ring structure 310 may, for example, protect the semiconductor device layer 302 from a die saw singulating the IC die and/or from gases that may be diffuse into the IC die from an ambient environment of the IC die.

A lower passivation layer 108 overlies the ILD layer 306, the seal ring structure 310, and the pads 308p. Further, a barrier layer 102, a lower seed layer 112, and an upper passivation layer 122 are stacked at each of the pads 308p. For ease of illustration, only one of the barrier layers 102 is labeled 102, only one of the lower seed layers 112 is labeled 112, and only one of the upper passivation layers 122 is labeled 122. Each of the barrier layers 102 overlies the lower passivation layer 108 and protrudes through the lower passivation layer 108 to contact a respective one of the pads 308p. Each of the lower seed layers 112 covers and lines a respective one of the barrier layers 102, and each of the upper passivation layers 122 overlies and lines a respective one of the lower seed layers 112.

A bump 120 and an upper seed layer 114 are stacked at each of the pads 308p. For ease of illustration, only one of the bumps 120 is labeled 120, and only one of the upper seed layers 114 is labeled 114. Each of the upper seed layers 114 overlies a respective one of the lower seed layers 112, within an opening defined by a respective one of the upper passivation layers 122. Further, each of the bumps 120 overlies a respective one of the upper seed layers 114. The bumps 120 each comprise a lower bump layer 116 and an upper bump layer 118 covering the lower bump layer 116. For ease of illustration, only one of the lower bump layers 116 is labeled 116 and only one of the upper bump layers 118 is labeled 118.

Figure 4A:
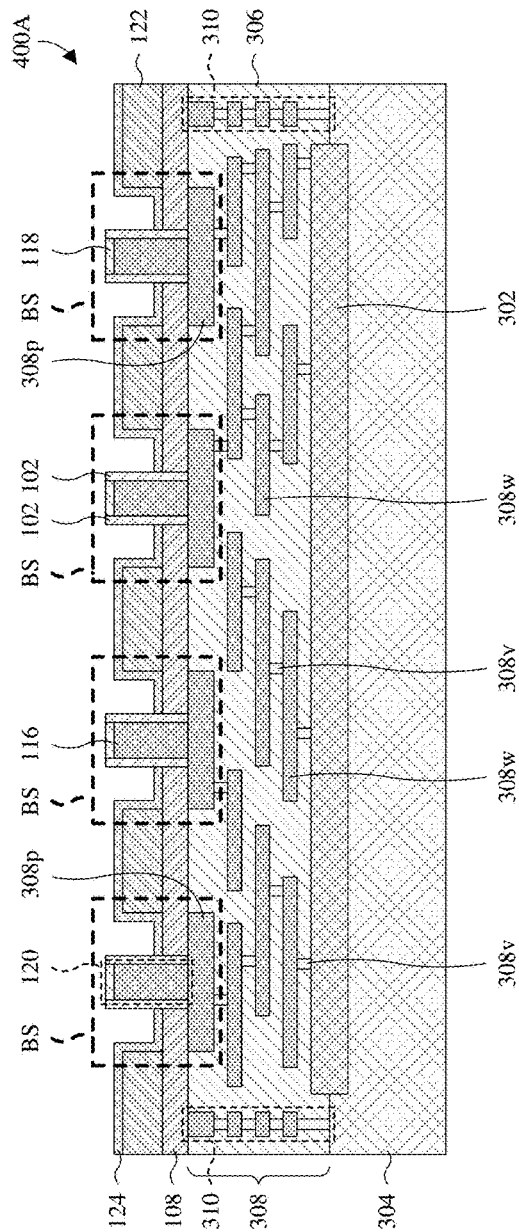
FIGS. 4A and 4B illustrate cross-sectional views of various alternative embodiments of the IC of FIG. 3 in which the barrier layer is a spacer.
Figure 4B:
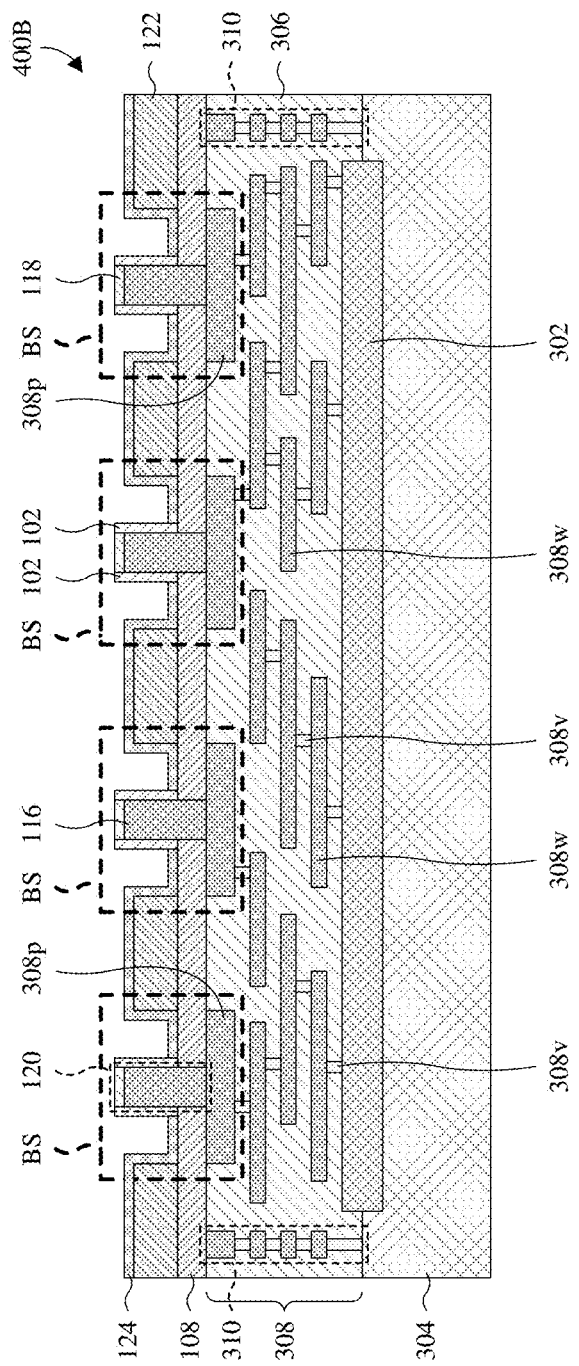

With reference to FIGS. 4A and 4B, cross-sectional views 400A, 400B of various alternative embodiments of the IC of FIG. 3 are provided in which the barrier layer 102 is a spacer. In contrast with the IC of FIG. 3, which includes the bump structure of FIG. 1, the ICs of FIGS. 4A and 4B respectively include the bump structures of FIGS. 2A and 2B.

With reference to FIGS. 5-13, a series of cross-sectional views 500-1300 of some embodiments of a method for manufacturing the bump structure of FIG. 1 is provided.

Figure 5:
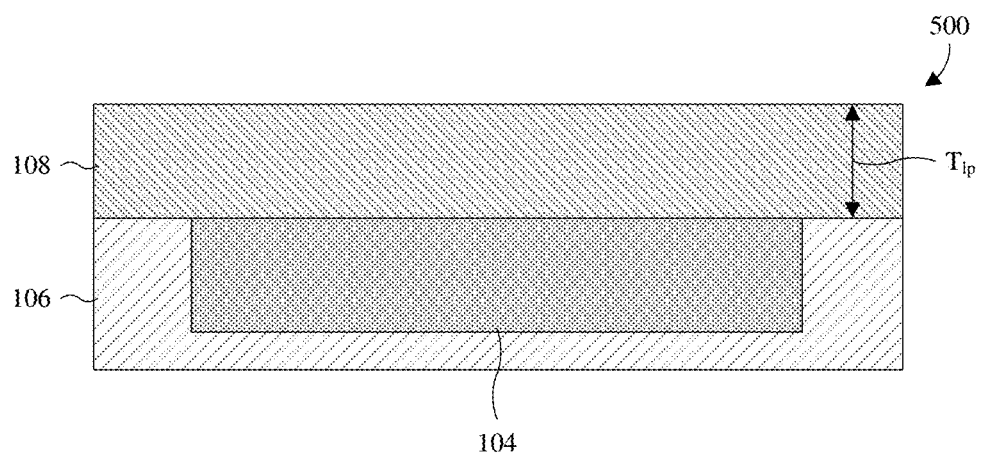
FIGS. 5-13 illustrate a series of cross-sectional views of some embodiments of a method for manufacturing the bump structure of FIG. 1.

As illustrated by the cross-sectional view 500 of FIG. 5, a pad 104 and a dielectric layer 106 are provided. The pad 104 is recessed into a top of the dielectric layer 106, such that a top surface of the pad 104 is even with a top surface of the dielectric layer 106. The pad 104 may be or otherwise comprise, for example, a pure metal (e.g., pure copper), a metal alloy (e.g., copper alloy), some other conductive material, or a combination of the foregoing. The dielectric layer 106 may be, for example, silicon dioxide, silicon nitride, a low κ dielectric, some other dielectric, or a combination of the foregoing. In some embodiments, the pad 104 is in a top metallization layer of a BEOL metallization stack, and/or the dielectric layer 106 is an ILD layer of the BEOL metallization stack. See, for example, FIG. 3.

Also illustrated by the cross-sectional view 500 of FIG. 5, a lower passivation layer 108 is formed covering the dielectric layer 106 and the pad 104. The lower passivation layer 108 may be formed by, for example, chemical or physical vapor deposition, sputtering, some other growth or deposition process, or a combination of the foregoing. In some embodiments, the lower passivation layer 108 is or otherwise comprises silicon dioxide, silicon nitride, silicon carbide, some other dielectric, or a combination of the foregoing. Further, in some embodiments, the lower passivation layer 108 has a thickness $T_{lp}$ between about 7000-9000 angstroms, about 7500-7600 angstroms, or about 8000-9000 angstroms.

Figure 6:
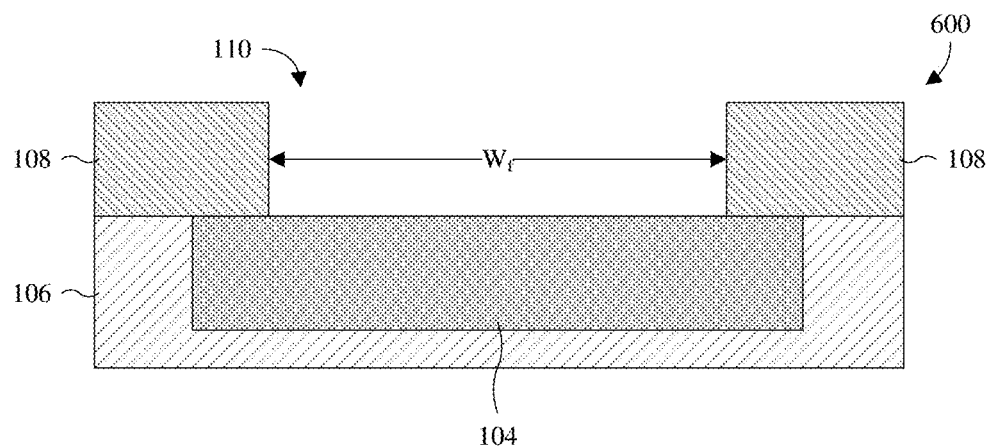

As illustrated by the cross-sectional view 600 of FIG. 6, a first etch is performed into the lower passivation layer 108 to form a first opening 110 overlying and exposing the pad 104. In some embodiments, the first opening 110 is formed completely overlying the pad 104 and/or spaced from sidewalls of the pad 104. Further, in some embodiments, the first opening 110 is formed with a width $W_f$ less than that of the pad 104. Further yet, in some embodiments, a process for performing the first etch comprises: forming a patterned photoresist layer (not shown) on the lower passivation layer 108; applying an etchant to the lower passivation layer 108 with the patterned photoresist layer in place; and stripping the patterned photoresist layer. The patterned photoresist layer may, for example, be patterned using photolithography.

Figure 7:
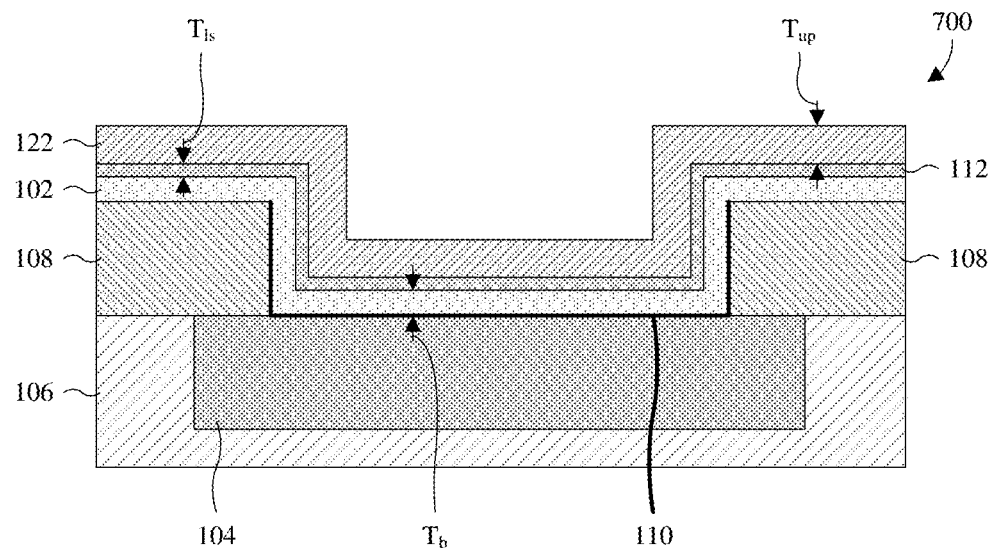

As illustrated by the cross-sectional view 700 of FIG. 7, a barrier layer 102 is formed covering the lower passivation layer 108 and the pad 104, and further lining the first opening 110. The barrier layer 102 may be formed by, for example, chemical or physical vapor deposition, sputtering, some other growth or deposition process, or a combination of the foregoing. In some embodiments, the barrier layer 102 is or otherwise comprises titanium nitride, titanium tungsten, tungsten nitride, tantalum nitride, some other barrier material, or a combination of the foregoing. Further, in some embodiments, the barrier layer 102 is a material that blocks pad material of the pad 104 from diffusing through the barrier layer 102. In some embodiments, the barrier layer 102 has a thickness $T_b$ between about 500-700 angstroms, about 550-650 angstroms, or about 300-900 angstroms.

Also illustrated by the cross-sectional view 700 of FIG. 7, a lower seed layer 112 is formed covering and lining the barrier layer 102, and an upper passivation layer 122 is formed covering and lining the lower seed layer 112. The lower seed layer 112 and the upper passivation layer 122 may be formed by, for example, chemical or physical vapor deposition, sputtering, some other growth or deposition process, or a combination of the foregoing. In some embodiments, the lower seed layer 112 is or otherwise comprises pure tantalum, pure titanium, pure copper, some other pure metal, some other seed material for a plating process, or a combination of the foregoing. Further, in some embodiments, the lower seed layer 112 has a thickness $T_{ls}$ between about 25-75 angstroms, about 45-55 angstroms, or about 40-90 angstroms. In some embodiments, the upper passivation layer 122 is or otherwise comprises silicon dioxide, silicon nitride, silicon carbide, some other dielectric, or a combination of the foregoing. Further, in some embodiments, the upper passivation layer 122 has a thickness $T_{up}$ between about 750-1250 angstroms, 500-1500 angstroms, or about 900-1100 angstroms.

Figure 8:
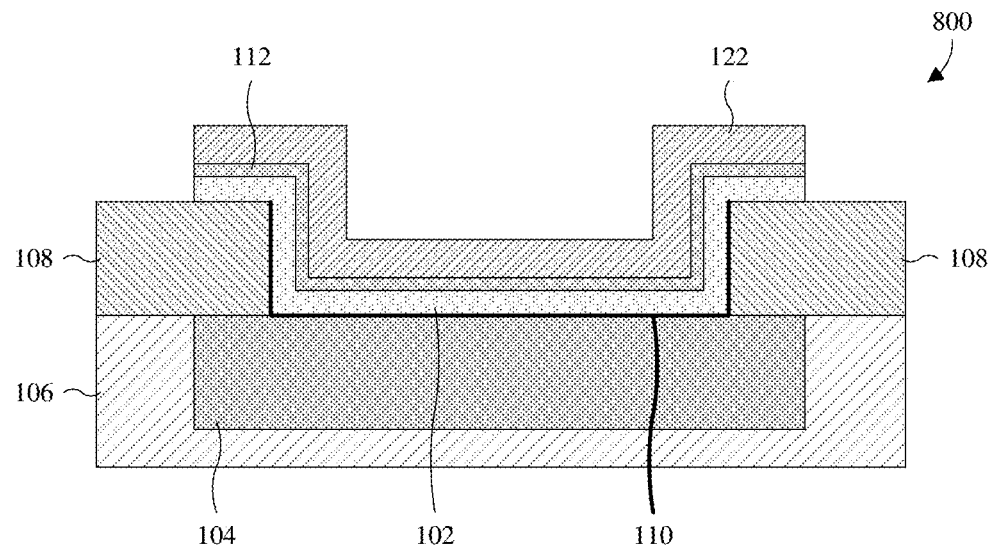

As illustrated by the cross-sectional view 800 of FIG. 8, a second etch is performed into the barrier layer 102, the lower seed layer 112, and the upper passivation layer 122 to localize the barrier layer 102, the lower seed layer 112, and the upper passivation layer 122 to the pad 104. In some embodiments, a process for performing the second etch comprises: forming a patterned photoresist layer (not shown) on the upper passivation layer 122; applying an etchant to the barrier layer 102, the lower seed layer 112, and the upper passivation layer 122 with the patterned photoresist layer in place; and stripping the patterned photoresist layer. The patterned photoresist layer may, for example, be patterned using photolithography.

Figure 9:
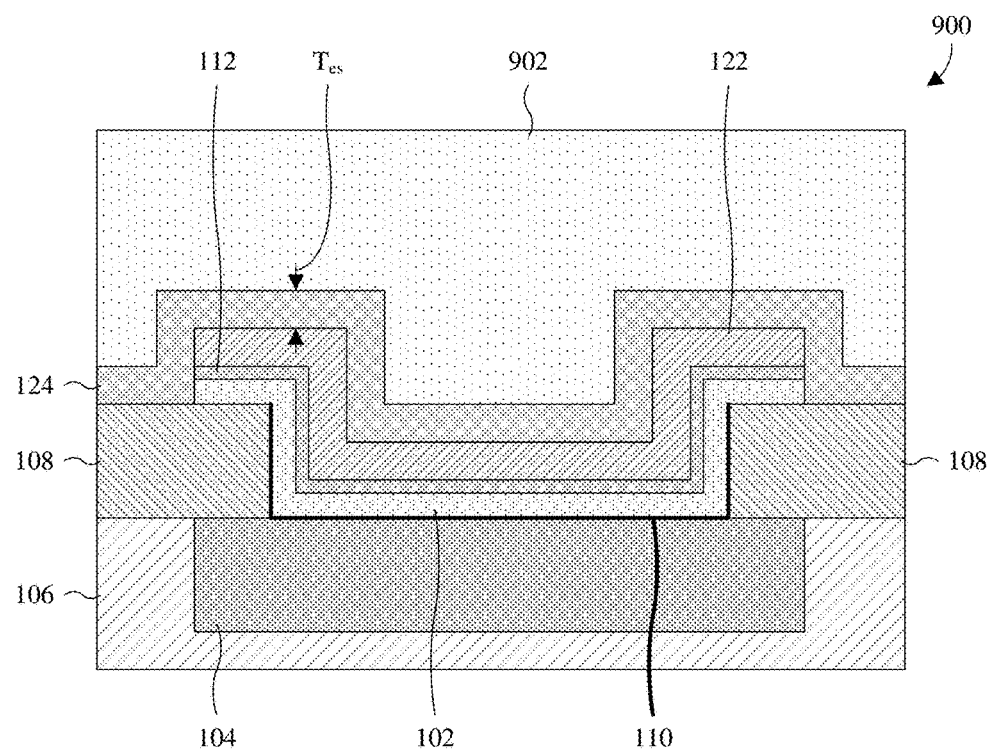

As illustrated by the cross-sectional view 900 of FIG. 9, an etch stop layer 124 is formed covering and lining the lower passivation layer 108 and the upper passivation layer 122. The etch stop layer 124 may be formed by, for example, chemical or physical vapor deposition, sputtering, some other growth or deposition process, or a combination of the foregoing. In some embodiments, the etch stop layer 124 is or otherwise comprises aluminum oxide, silicon nitride, silicon dioxide, some other dielectric, or a combination of the foregoing. In some embodiments, the etch stop layer 124 has a thickness $T_{es}$ between about 100-200 angstroms, 160-170 angstroms, or about 50-300 angstroms.

Also illustrated by the cross-sectional view 900 of FIG. 9, a sacrificial layer 902 is formed covering the etch stop layer 124. In some embodiments, a bottom of the sacrificial layer 902 conforms to the etch stop layer 124, and/or a top surface of the sacrificial layer 902 is substantially planar. Further, in some embodiments, the sacrificial layer 902 is silicon dioxide, silicon nitride, some other oxide or nitride, some other dielectric, or a combination of the foregoing. In some embodiments, a process for forming the sacrificial layer 902 comprises depositing or growing the sacrificial layer on the etch stop layer 124, and subsequently performing a planarization into the top surface of the sacrificial layer 902. The depositing or growing may, for example, be performed by chemical or physical vapor deposition, sputtering, some other growth or deposition process, or a combination of the foregoing. The planarization may, for example, be performed by a chemical mechanical polish (CMP).

Figure 10:
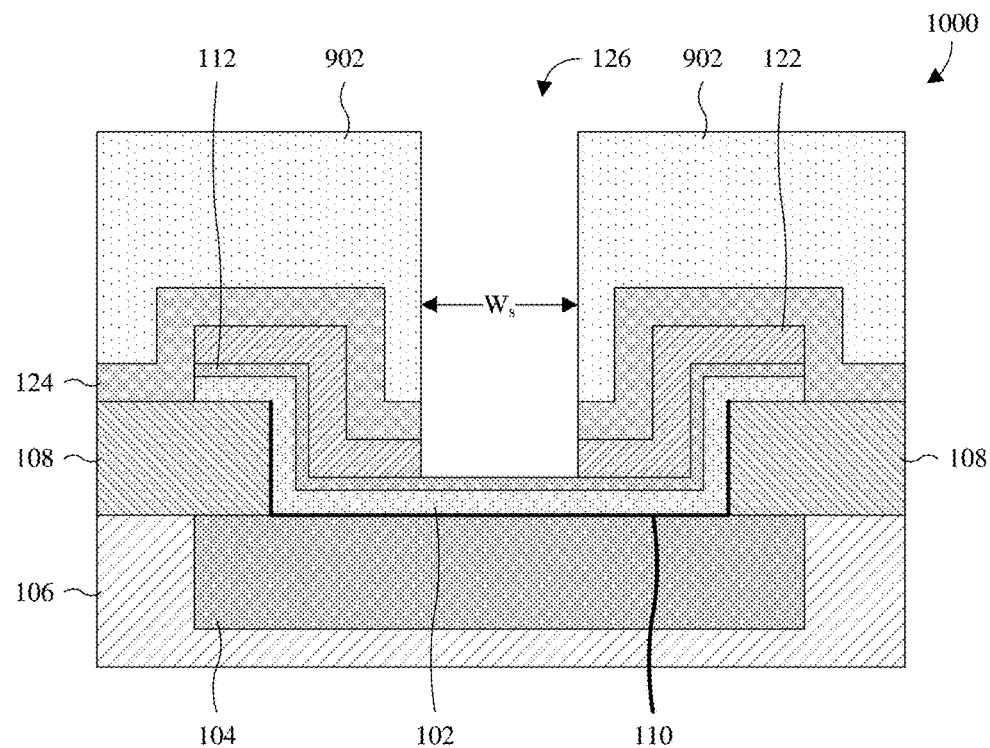

As illustrated by the cross-sectional view 1000 of FIG. 10, a third etch is performed into the sacrificial layer 902, the etch stop layer 124, and the upper passivation layer 122 to form a second opening 126 overlying the pad 104 and exposing the lower seed layer 112. In some embodiments, the second opening 126 is formed in the first opening 110 and/or spaced from sidewalls of the first opening 110. Further, in some embodiments, the second opening 126 is formed with a width $W_s$ less than that of the first opening 110. Further yet, in some embodiments, a process for performing the third etch comprises: forming a patterned photoresist layer (not shown) on the sacrificial layer 902; applying an etchant to the sacrificial layer 902, the etch stop layer 124, and the upper passivation layer 122 with the patterned photoresist layer in place; and stripping the patterned photoresist layer. The patterned photoresist layer may, for example, be patterned using photolithography.

Figure 11:
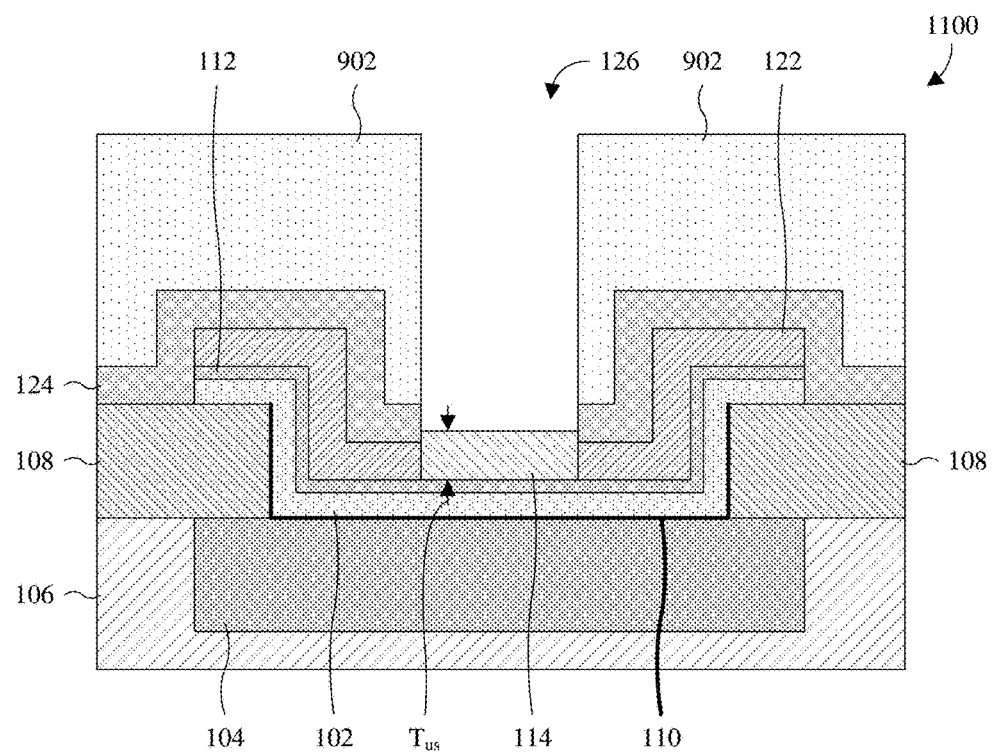

As illustrated by the cross-sectional view 1100 of FIG. 11, an upper seed layer 114 is formed on the lower seed layer 112, within the second opening 126. In some embodiments, the upper seed layer 114 is or otherwise comprises cobalt, copper, tantalum, titanium, some other seed material, or a combination of the foregoing. Further, in some embodiments, the upper seed layer 114 has a thickness $T_{us}$ between about 165-2000 angstroms, about 165-1000 angstroms, or about 435-1500 angstroms. The upper seed layer 114 may, for example, be formed by electroless plating, electroplating, some other plating process, some other growth or deposition process, or a combination of the foregoing. Further, the upper seed layer 114 may, for example, be deposited (e.g., by electroless plating) using the lower seed layer 112.

Figure 12:
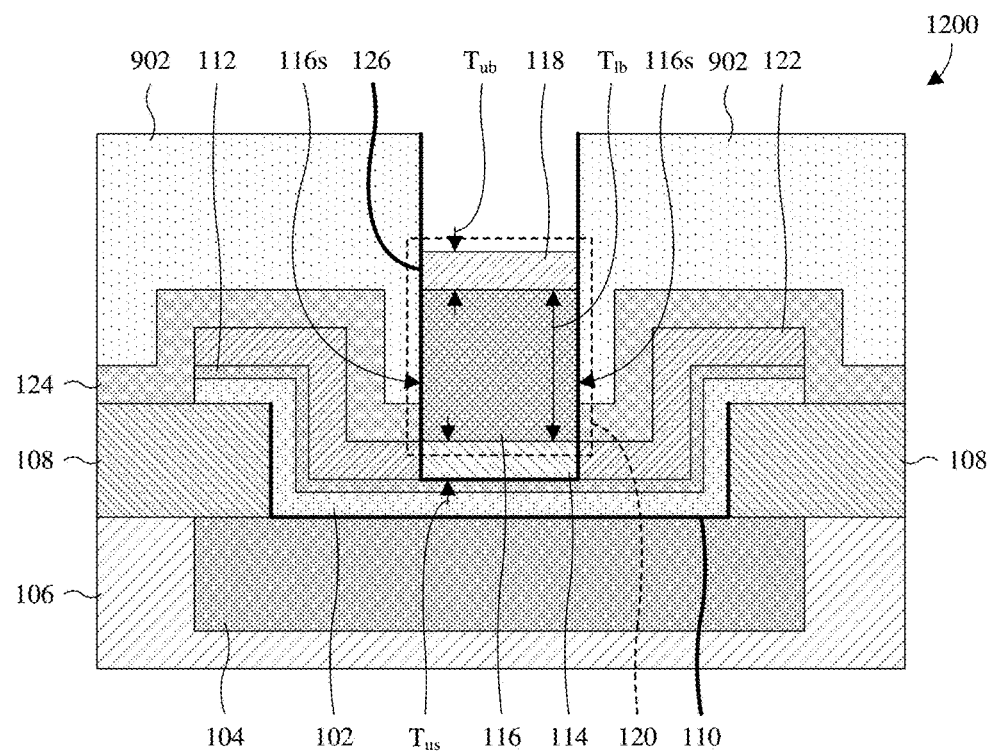

As illustrated by the cross-sectional view 1200 of FIG. 12, a bump 120 is formed on the upper seed layer 114, within the second opening 126. The bump 120 may be, for example, a nickel/gold bump. The bump 120 comprises a lower bump layer 116 and an upper bump layer 118 covering the lower bump layer 116. In some embodiments, the lower bump layer 116 is pure nickel, nickel alloy, some other metal, some other conductive material, or a combination of the foregoing. Further, in some embodiments, the lower bump layer 116 has a thickness $T_{lb}$ between about 3000-8000 angstroms, about 4000-7000 angstroms, or about 5000-9000 angstroms. Further yet, in some embodiments, sidewalls 116s of the lower bump layer 116 contact the sacrificial layer 902, the etch stop layer 124, and/or the upper passivation layer 122, and/or gaps (not visible) are between the sidewalls 116s and the sacrificial layer 902, between the sidewalls 116s and the etch stop layer 124, and/or between the sidewalls 116s the upper passivation layer 122. In some embodiments, the upper bump layer 118 is gold, platinum, iridium, ruthenium, rhodium, some other noble metal, some other conductive material more resistant to oxidation and corrosion than the lower bump layer 116, or a combination of the foregoing. Further, in some embodiments, the upper bump layer 118 has a thickness $T_{ub}$ between about 300-700 angstroms, about 400-600 angstroms, or about 450-550 angstroms.

The lower bump layer 116 may, for example, be formed by electroless plating, electroplating, some other plating process, some other growth or deposition process, or a combination of the foregoing. Further, the lower bump layer 116 may, for example, be deposited (e.g., by electroless plating) using the upper seed layer 114. The upper bump layer 118 may, for example, be formed by immersion plating, electroless plating, electroplating, some other plating process, some other growth or deposition process, or a combination of the foregoing. In some embodiments, the lower bump layer 116 is formed by electroless plating and the upper bump layer 118 is formed by immersion gold plating. Further, in some embodiments, the formation of the lower bump layer 116 consumes at least some of the upper seed layer 114. For example, the formation of the lower bump layer 116 may consume about 60-70 angstroms, about 50-80 angstroms, or about 40-100 angstroms. Due to such consumption of the upper seed layer 114, the thickness $T_{us}$ of the upper seed layer 114 is greater than or equal to about 160 angstroms before formation of the lower bump layer 116. Absent at least 160 angstroms, lower bump layer 116 may fail to form and/or form with an abnormal (e.g., non-uniform) thickness.

Figure 13:
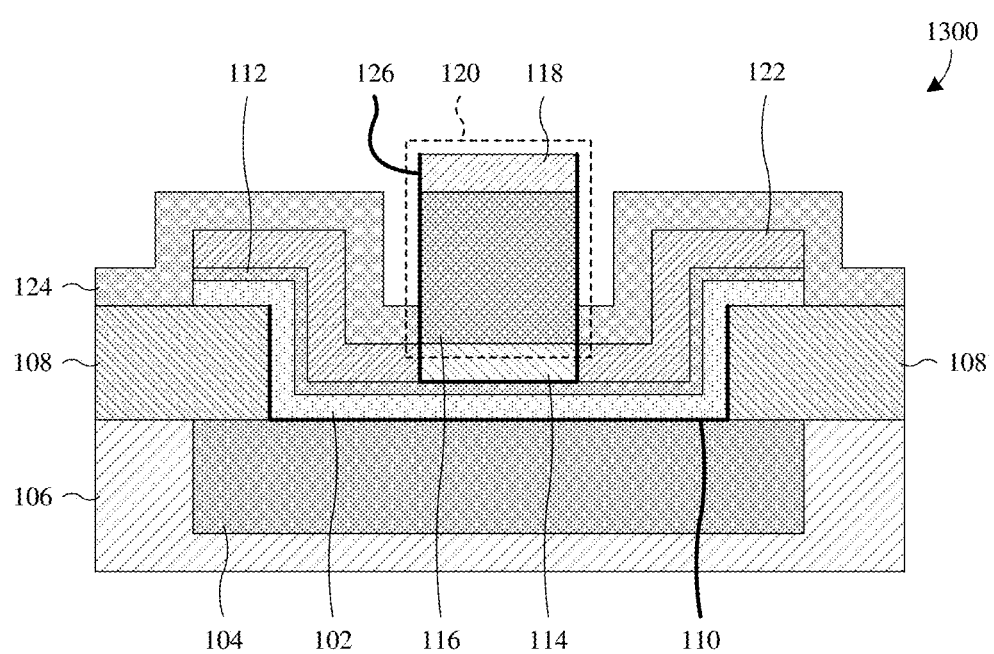

As illustrated by the cross-sectional view 1300 of FIG. 13, a fourth etch is performed into the sacrificial layer 902 (see FIG. 12) to remove the sacrificial layer 902. In some embodiments, the fourth etch stops on the etch stop layer 124 and/or uses an etchant with a lower etch rate for the etch stop layer 124 than the sacrificial layer 902.

High temperature processes performed between formation of the bump 120 and removal of the sacrificial layer 902 (see FIG. 12) may promote diffusion. Further, formation of the lower bump layer 116 may lead to gaps (not visible) along sidewalls 116s (see FIG. 12) of the lower bump layer 116 that provide a diffusion path along the sidewalls 116s, from the pad 104 to the upper bump layer 118. The gaps may, for example, form between the lower bump layer 116 and the sacrificial layer 902, between the lower bump layer 116 and the etch stop layer 124, and/or between the lower bump layer 116 and the upper passivation layer 122 while forming the lower bump layer 116 using electroless nickel plating with a low phosphorous concentration. The barrier layer 102 blocks the upward diffusion or movement of pad material (e.g., pure copper) along the sidewalls 116s of the lower bump layer 116, from the pad 104 to the upper bump layer 118. Accordingly, the barrier layer 102 prevents the pad material from contaminating the upper bump layer 118, such that contact resistance of the upper bump layer 118 is low and bondability of the upper bump layer 118 to BCB is high. As such, yields may be high during bulk manufacture and packaging of ICs incorporating the bond structure.

Figure 14:
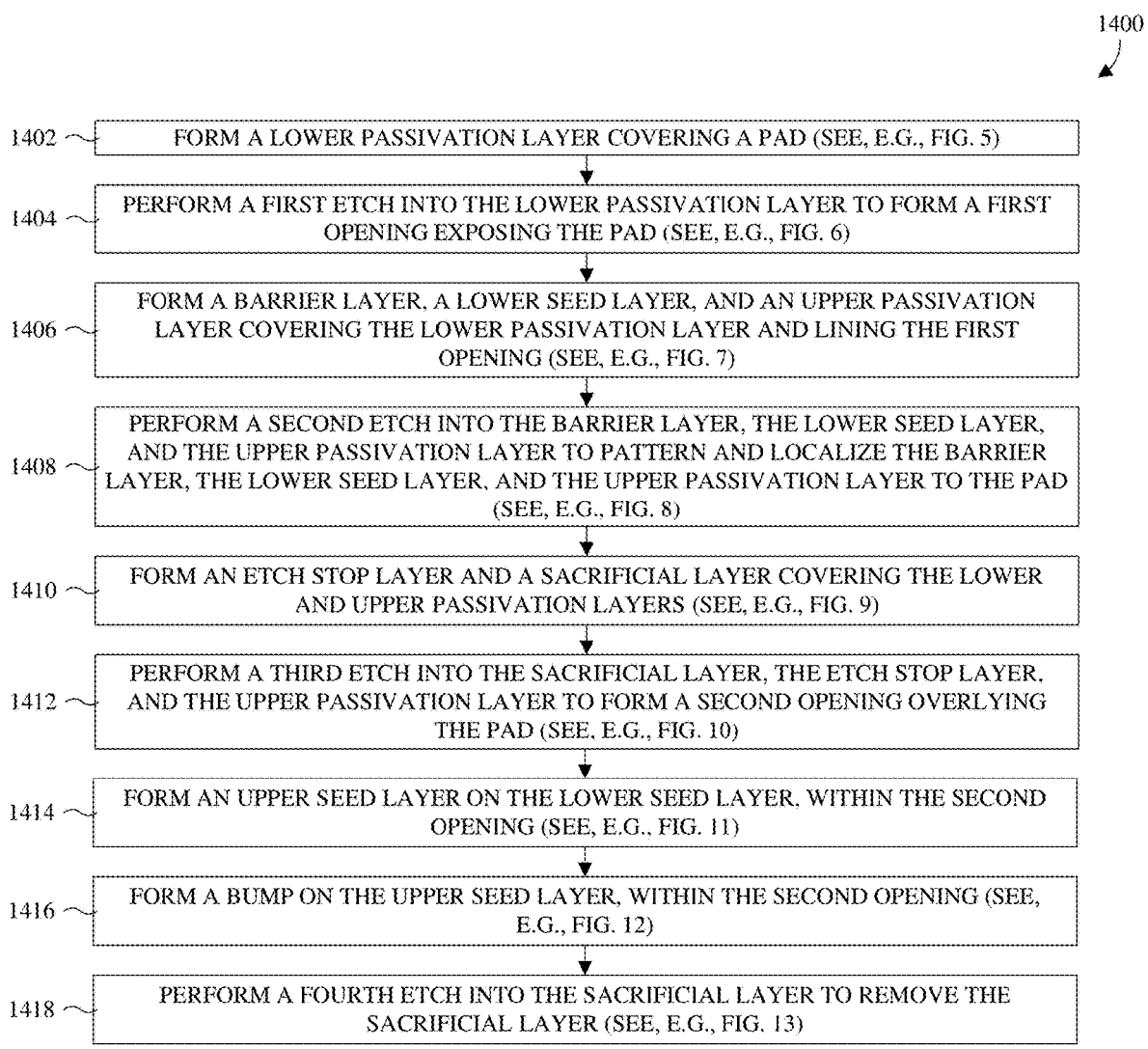
FIG. 14 illustrates a flowchart of some embodiments of the method of FIGS. 5-13.

With reference to FIG. 14, a flowchart 1400 of some embodiments of the method of FIGS. 5-13 is provided.

At 1402, a lower passivation layer is formed covering a pad. See, for example, FIG. 5.

At 1404, a first etch is performed into the lower passivation layer to form a first opening exposing the pad. See, for example, FIG. 6.

At 1406, a barrier layer, a lower seed layer, and an upper passivation layer are formed covering the lower passivation layer and lining the first opening. See, for example, FIG. 7.

At 1408, a second etch is performed into the barrier layer, the lower seed layer, and the upper passivation layer to localize the barrier layer, the lower seed layer, and the upper passivation layer to the pad. See, for example, FIG. 8.

At 1410, an etch stop layer and a sacrificial layer are formed covering the lower and upper passivation layers. See, for example, FIG. 9.

At 1412, a third etch is performed into the sacrificial layer, the etch stop layer, and the upper passivation layer to form a second opening overlying the pad. See, for example, FIG. 10.

At 1414, an upper seed layer is formed on the lower seed layer, within the second opening. See, for example, FIG. 11.

At 1416, a bump is formed on the upper seed layer, within the second opening. See, for example, FIG. 12.

At 1418, a fourth etch is performed into the sacrificial layer to remove the sacrificial layer. See, for example, FIG. 13.

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 15-17, 18A-18F, and 19A-19F, a series of cross-sectional views 1500-1700, 1800A-1800F, 1900A-1900F of some embodiments of a method for manufacturing the bump structures of FIGS. 2A and 2B is provided. The cross-sectional views 1500-1700 and 1800A-1800F illustrate the manufacture of the bump structure of FIG. 2A, and the cross-sectional views 1500-1700 and 1900A-1900F illustrate the manufacture of the bump structure of FIG. 2B. Hereafter, unless noted otherwise, elements of FIGS. 15-17, 18A-18F, and 19A-19F with like reference numerals as elements in FIGS. 5-13 may, for example, be formed as described in FIGS. 5-13.

Figure 15:
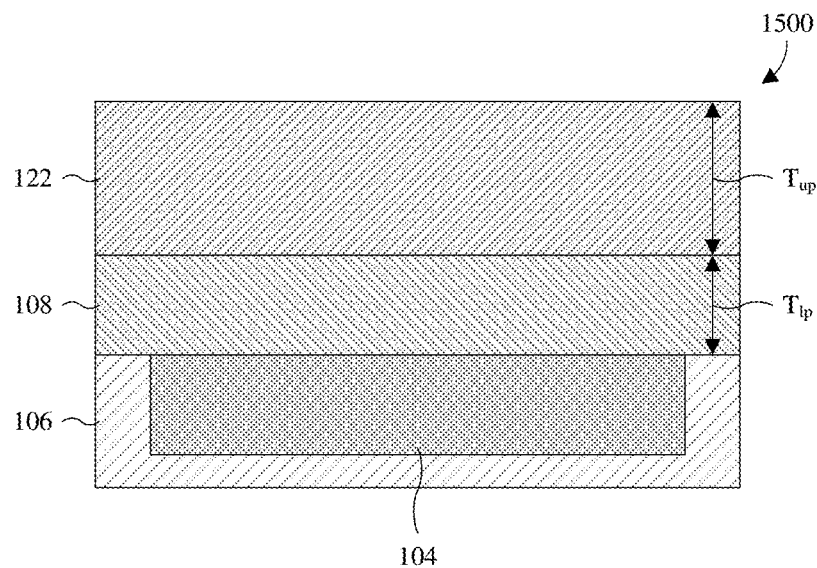
FIGS. 15-17, 18A-18F, and 19A-19F illustrate a series of cross-sectional views of some embodiments of a method for manufacturing the bump structures of FIGS. 2A and 2B.

As illustrated by the cross-sectional view 1500 of FIG. 15, a pad 104 and a dielectric layer 106 are provided, where the pad 104 is recessed into a top of the dielectric layer 106. In some embodiments, the pad 104 is in a top metallization layer of a BEOL metallization stack, and/or the dielectric layer 106 is an ILD layer of the BEOL metallization stack. See, for example, FIGS. 4A and 4B.

Also illustrated by the cross-sectional view 1500 of FIG. 15, a lower passivation layer 108 is formed covering the dielectric layer 106 and the pad 104, and an upper passivation layer 122 is formed covering the lower passivation layer 108. The lower and upper passivation layers 108, 122 may be formed by, for example, chemical or physical vapor deposition, sputtering, some other growth or deposition process, or a combination of the foregoing. In some embodiments, the thickness $T_{up}$ of the upper passivation layer 122 is between about 5000-6000 angstroms, about 5400-5600 angstroms, or about 4000-7000 angstroms. Further, in some embodiments, the thickness $T_{lp}$ of the lower passivation layer 108 is between about 1000-3000 angstroms, about 2000-2100 angstroms, or about 1750-2250 angstroms.

Figure 16:
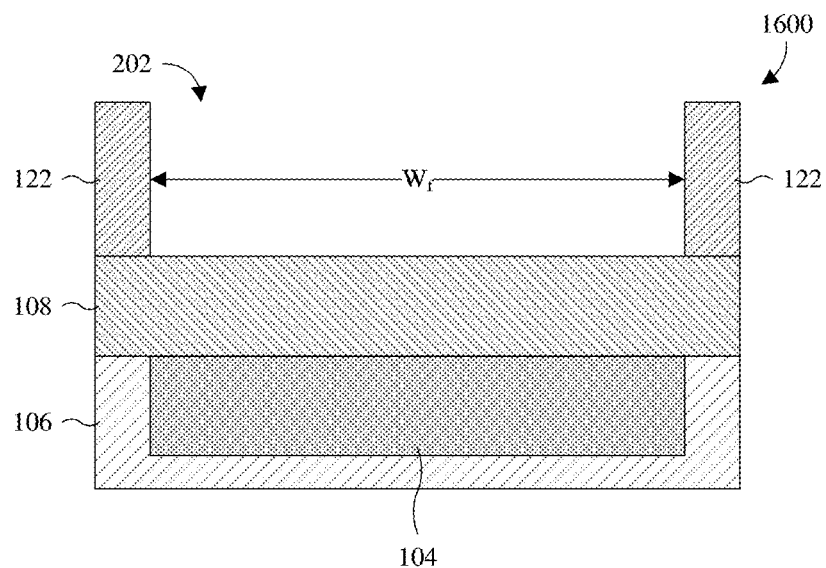

As illustrated by the cross-sectional view 1600 of FIG. 16, a first etch is performed into the upper passivation layer 122 to form a first opening 202 overlying and exposing the lower passivation layer 108. In some embodiments, the first opening 202 is formed with a width $W_f$ less than or about equal to that of the pad 104. Further, in some embodiments, a process for performing the first etch comprises: forming a patterned photoresist layer (not shown) on the upper passivation layer 122; applying an etchant to the upper passivation layer 122 with the patterned photoresist layer in place; and stripping the patterned photoresist layer. The patterned photoresist layer may, for example, be patterned using photolithography.

Figure 17:
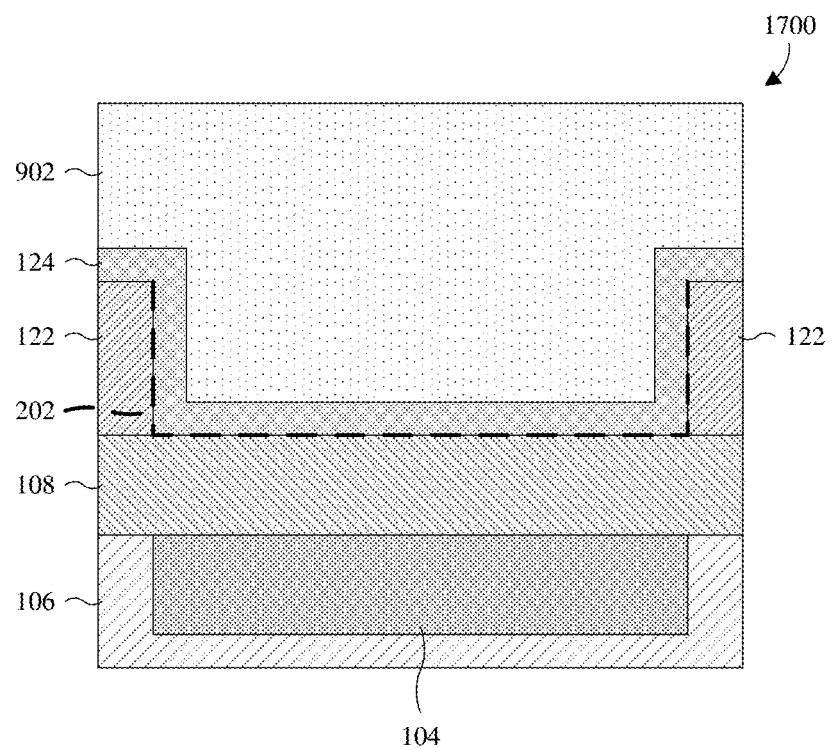

As illustrated by the cross-sectional view 1700 of FIG. 17, an etch stop layer 124 is formed covering the upper passivation layer 122, and further lining the first opening 202. Also illustrated by the cross-sectional view 1700 of FIG. 17, a sacrificial layer 902 is formed covering the etch stop layer 124. In some embodiments, a process for forming the sacrificial layer 902 comprises depositing or growing the sacrificial layer on the etch stop layer 124, and subsequently performing a planarization into a top surface of the sacrificial layer 902.

Figure 18A:
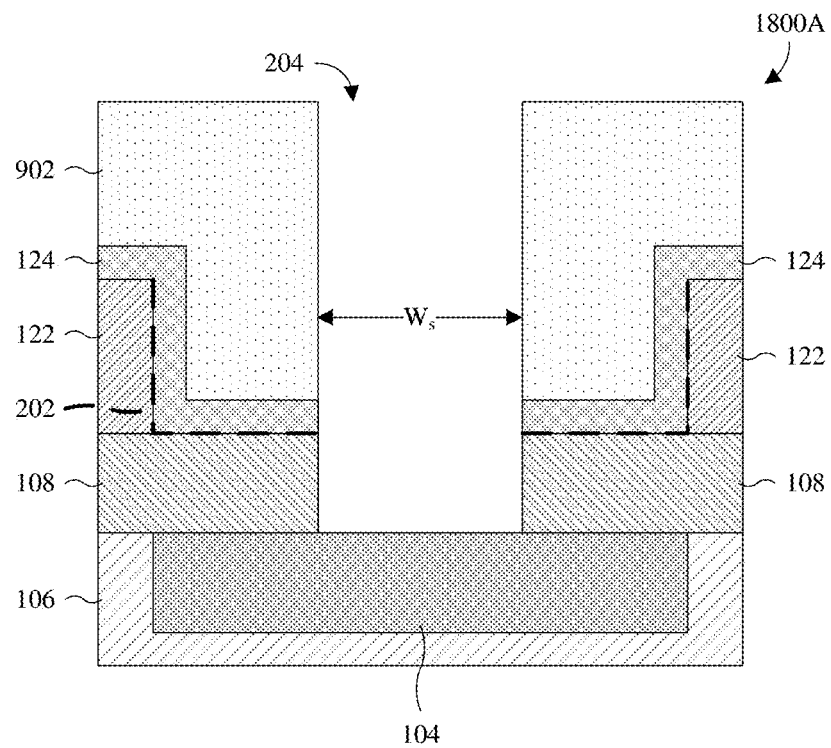

As illustrated by the cross-sectional view 1800A of FIG. 18A, a second etch is performed into the sacrificial layer 902, the etch stop layer 124, and the lower passivation layer 108 to form a second opening 204 overlying and exposing the pad 104. In some embodiments, the second opening 204 is formed in the first opening 202, and is formed with a width $W_s$ less than that of the first opening 202. Further, in some embodiments, a process for performing the second etch comprises: forming a patterned photoresist layer (not shown) on the sacrificial layer 902; applying an etchant to the sacrificial layer 902, the etch stop layer 124, and the lower passivation layer 108 with the patterned photoresist layer in place; and stripping the patterned photoresist layer.

Figure 18B:
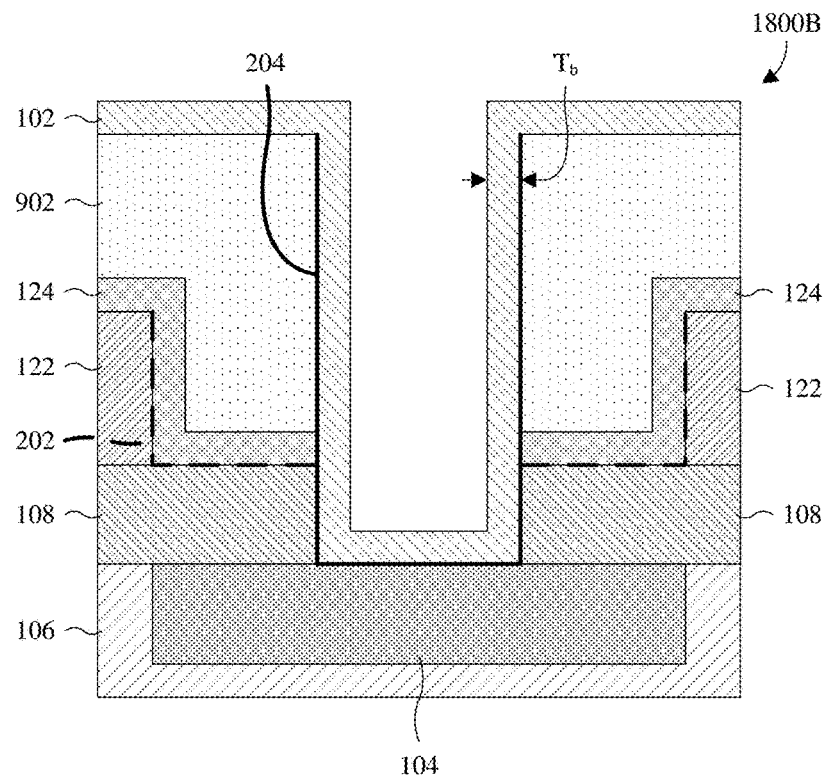

As illustrated by the cross-sectional view 1800B of FIG. 18B, a barrier layer 102 is formed covering the sacrificial layer 902 and the pad 104, and further lining the second opening 204. The barrier layer 102 may be formed by, for example, chemical or physical vapor deposition, sputtering, some other growth or deposition process, or a combination of the foregoing. In some embodiments, the barrier layer 102 has a thickness $T_b$ between about 400-700 angstroms, about 450-550 angstroms, or about 300-1000 angstroms. In some embodiments, the barrier layer 102 is or otherwise comprises titanium nitride, titanium tungsten, tungsten nitride, tantalum nitride, aluminum oxide, some other barrier material, or a combination of the foregoing. Further, in some embodiments, the barrier layer 102 is a material that blocks pad material of the pad 104 from diffusing through the barrier layer 102.

Figure 18C:
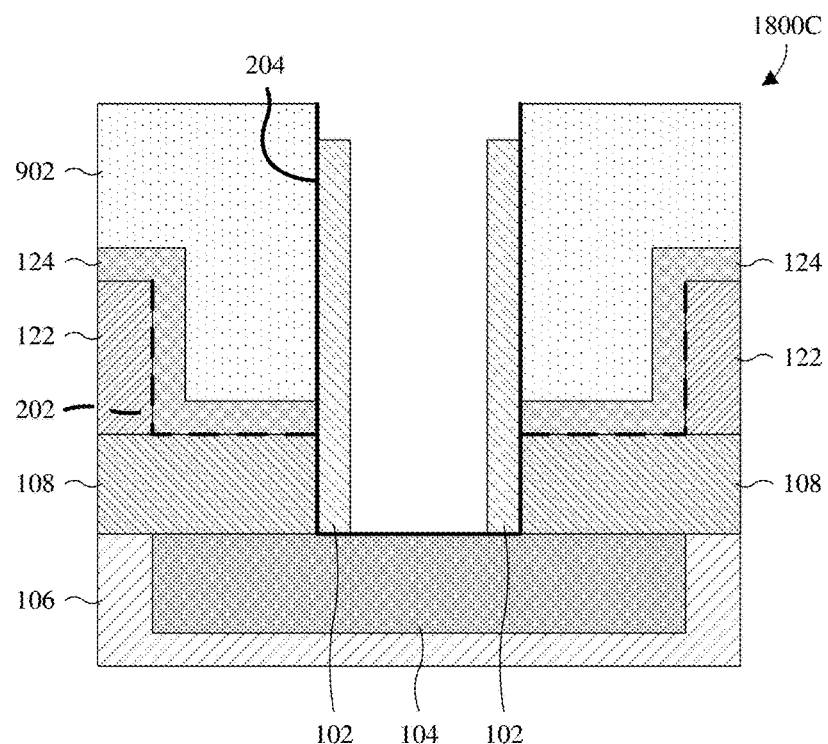

As illustrated by the cross-sectional view 1800C of FIG. 18C, a third etch is performed into the barrier layer 102 to remove horizontal segments of the barrier layer 102, without removing vertical segments of the barrier layer 102. The vertical segments of the barrier layer 102 line sidewalls of second opening 204 and define a spacer structure. In some embodiments, the third etch is performed by applying an etchant to the barrier layer 102 that has a higher etch rate for the barrier layer 102 than the sacrificial layer 902 and the pad 104, such that the pad 104 and the sacrificial layer 902 serve as etch stops.

Figure 18D:
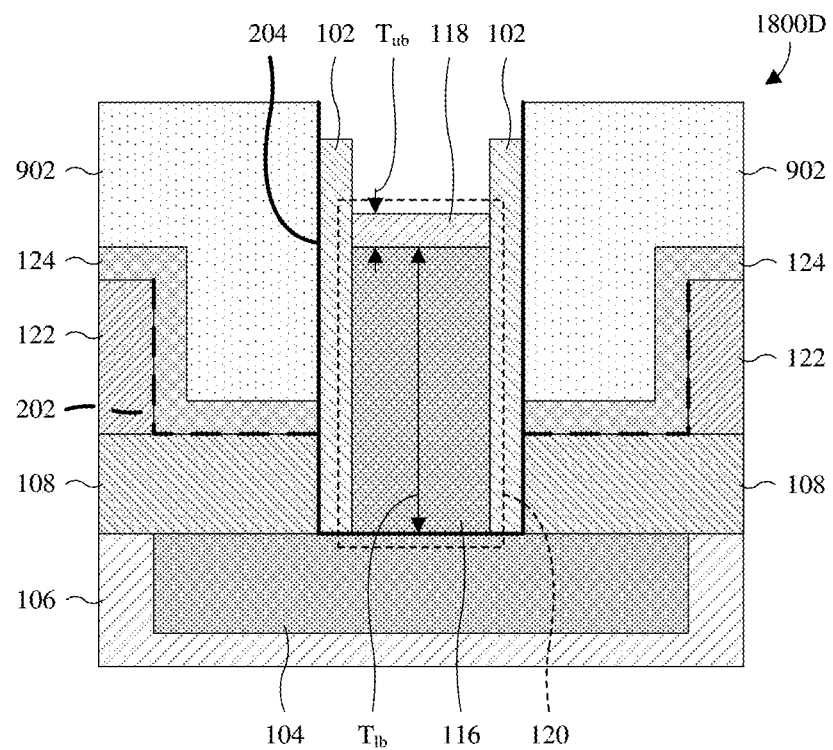

As illustrated by the cross-sectional view 1800D of FIG. 18D, a bump 120 is formed on the pad 104, within the second opening 204. The bump 120 comprises a lower bump layer 116 and an upper bump layer 118 covering the lower bump layer 116. In some embodiments, the lower bump layer 116 has a thickness $T_{lb}$ between about 3000-9000 angstroms, about 7000-8000 angstroms, or about 8000-9000 angstroms. In some embodiments, the upper bump layer 118 has a thickness $T_{ub}$ between about 300-700 angstroms, about 400-600 angstroms, or about 450-550 angstroms. The lower bump layer 116 may, for example, be formed by electroless plating, electroplating, some other plating process, some other growth or deposition process, or a combination of the foregoing. Further, the lower bump layer 116 may, for example, be deposited (e.g., by electroless plating) using the pad 104 as a seed. The upper bump layer 118 may, for example, be formed by immersion plating, electroless plating, electroplating, some other plating process, some other growth or deposition process, or a combination of the foregoing.

Figure 18E:
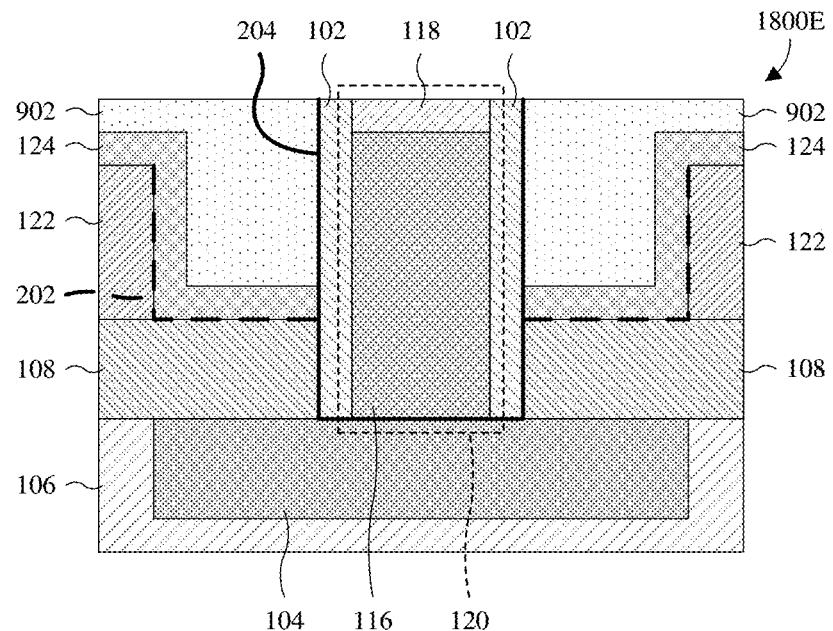

As illustrated by the cross-sectional view 1800E of FIG. 18E, a top surface of the barrier layer 102 is recessed to even with or below a top surface of the bump 120. In some embodiments, the recessing is performed by an etch back. In other embodiments, the recessing is performed by a planarization. For example, an additional sacrificial layer (not shown) may be formed filling a remainder of the second opening 204, and a planarization may be performed into the sacrificial layer, the additional sacrificial layer, and the barrier layer 102 until the additional sacrificial layer is removed and the bump 120 is reached. The planarization may, for example, be performed by a CMP.

Figure 18F:
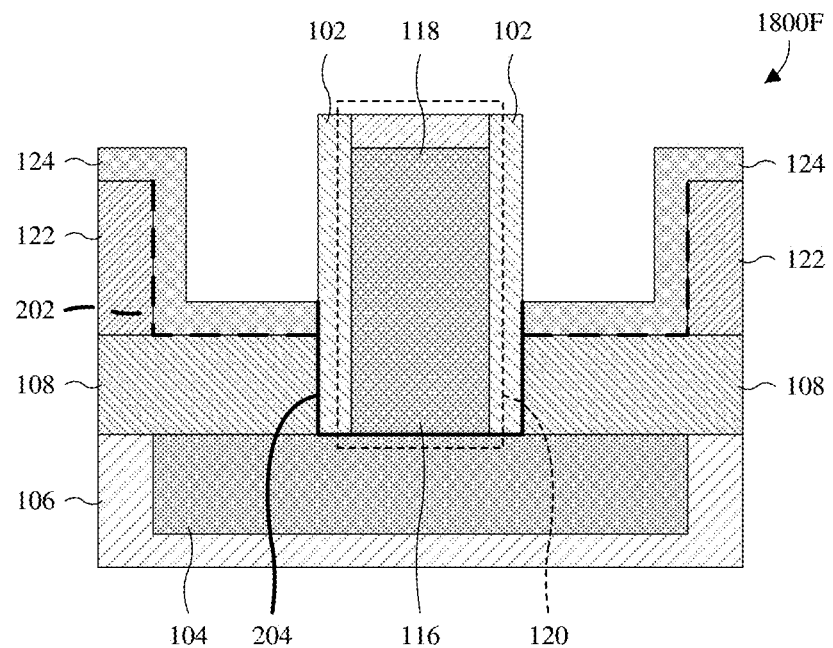

As illustrated by the cross-sectional view 1800F of FIG. 18F, a fourth etch is performed into the sacrificial layer 902 (see FIG. 18E) to remove the sacrificial layer 902. In some embodiments, the fourth etch stops on the etch stop layer 124.

High temperature processes performed between formation of the bump 120 and removal of the sacrificial layer 902 may promote diffusion. The barrier layer 102 blocks the upward diffusion or movement of pad material (e.g., pure copper) along sidewalls of the lower bump layer 116, from the pad 104 to the upper bump layer 118. This prevents the pad material from contaminating the upper bump layer 118.

The cross-sectional views 1800A-1800F illustrate the manufacture of the bump structure in FIG. 2A. In alternative embodiments, the cross-sectional views 1900A-1900F of FIGS. 19A-19F may be performed in place of the cross-sectional views 1800A-1800F of FIGS. 18A-18F to manufacture the bump structure of FIG. 2B. In such alternative embodiments, the cross-sectional views 1900A-1900F of FIG. 19A-19F continue from FIG. 17.

Figure 19A:
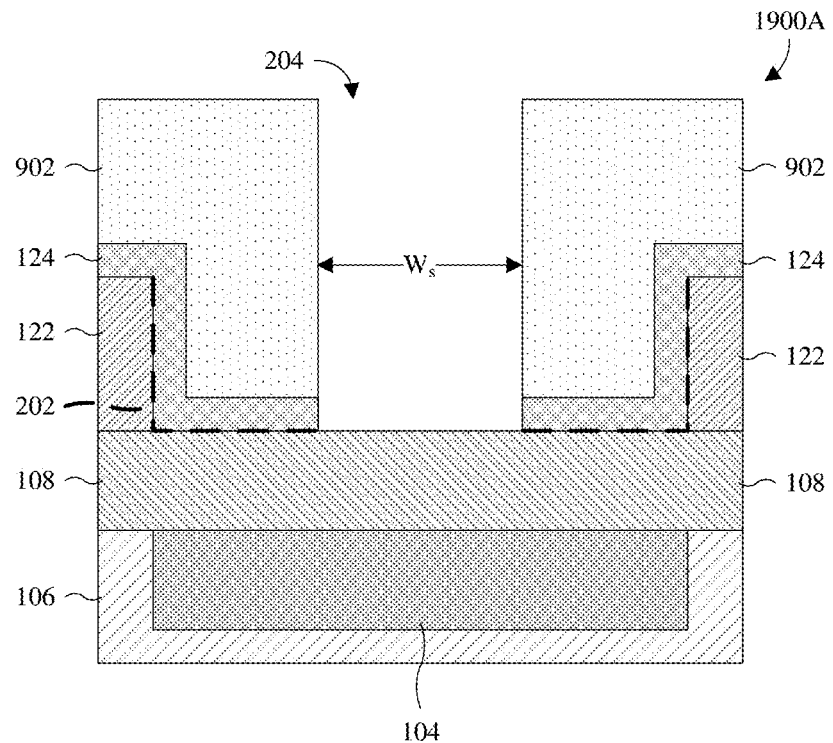

As illustrated by the cross-sectional view 1900A of FIG. 19A, a second etch is performed into the sacrificial layer 902 and the etch stop layer 124 to form a second opening 204 overlying the pad 104 and exposing the lower passivation layer 108. In some embodiments, the second opening 204 is formed in the first opening 202, and is formed with a width $W_s$ less than that of the first opening 202. Further, in some embodiments, a process for performing the second etch comprises: forming a patterned photoresist layer (not shown) on the sacrificial layer 902; applying an etchant to the sacrificial layer 902 and the etch stop layer 124 with the patterned photoresist layer in place; and stripping the patterned photoresist layer.

Figure 19B:
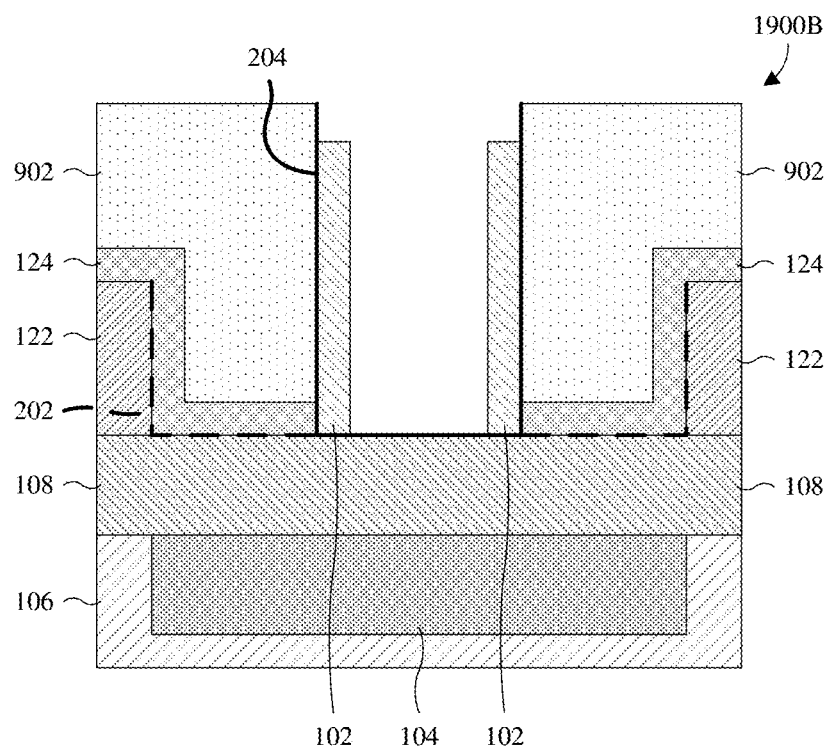

As illustrated by the cross-sectional view 1900B of FIG. 19B, a barrier layer 102 is formed lining sidewalls of the second opening 204. In some embodiments, a process for forming the barrier layer 102 comprises forming the barrier layer 102 covering the sacrificial layer 902 and the pad 104, and further lining the second opening 204. The barrier layer 102 may be formed by, for example, chemical or physical vapor deposition, sputtering, some other growth or deposition process, or a combination of the foregoing. Further, in some embodiments, the process comprises performing an etch into the barrier layer 102 to remove horizontal segments of the barrier layer 102 without removing vertical segments of the barrier layer 102. FIGS. 18B and 18C provide an example of the process.

Figure 19C:
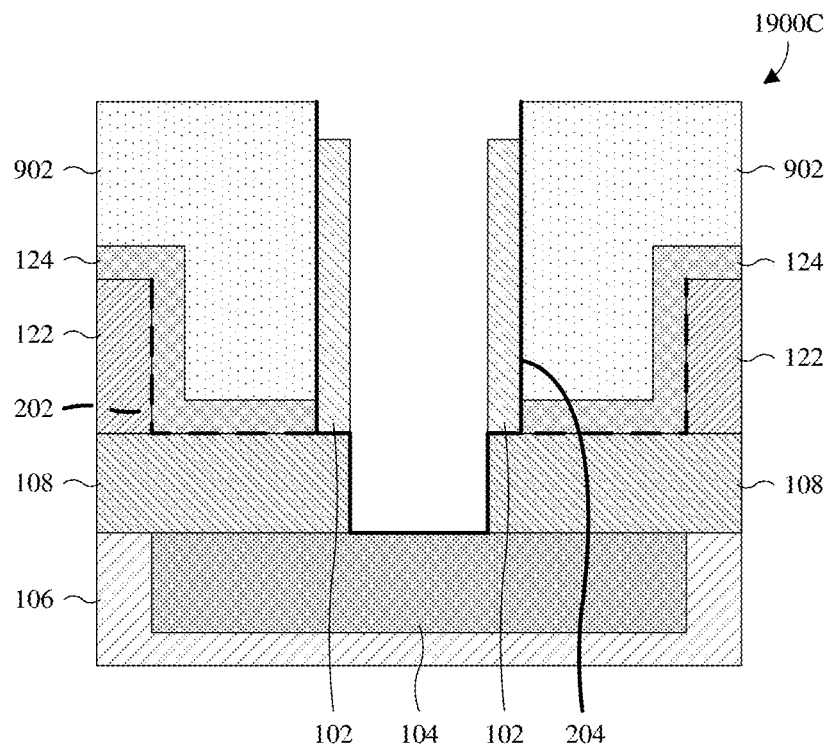

As illustrated by the cross-sectional view 1900C of FIG. 19C, a third etch is performed into the lower passivation layer 108 to expand the second opening 204 into the lower passivation layer 108, thereby exposing the pad 104. In some embodiments, the second opening 204 has a stepped profile after expansion. Further, in some embodiments, a process for performing the third etch comprises applying an etchant to the lower passivation layer 108 with the barrier layer 102 and the sacrificial layer 902 in place so the barrier layer 102 and the sacrificial layer 902 collectively act as a mask for the third etch.

Figure 19D:
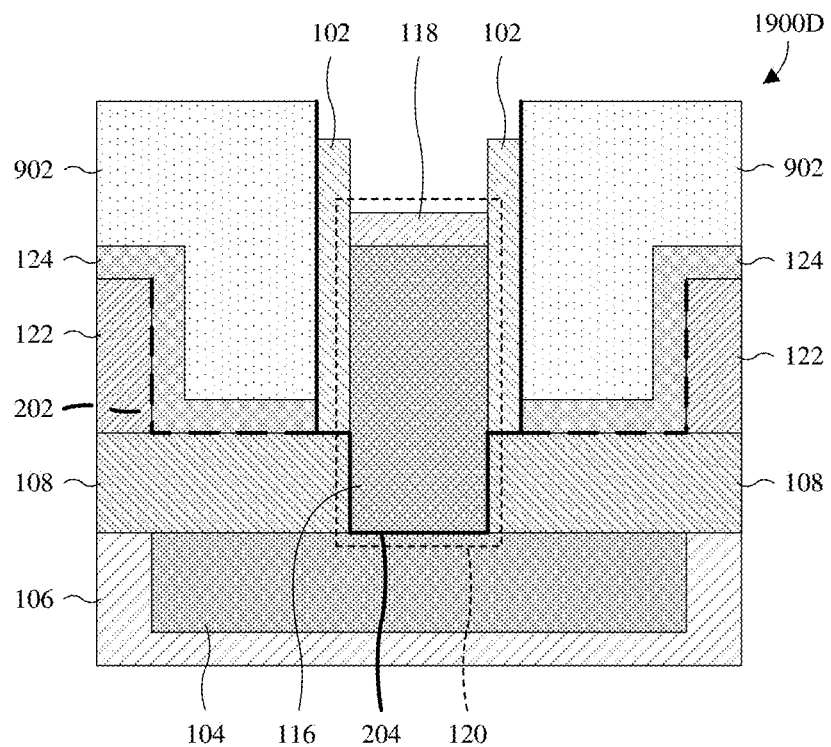

As illustrated by the cross-sectional view 1900D of FIG. 19D, a bump 120 is formed on the pad 104, within the second opening 204. The bump 120 comprises a lower bump layer 116 and an upper bump layer 118 covering the lower bump layer 116. The lower bump layer 116 may, for example, be formed by electroless plating, electroplating, some other plating process, some other growth or deposition process, or a combination of the foregoing. The upper bump layer 118 may, for example, be formed by immersion plating, electroless plating, electroplating, some other plating process, some other growth or deposition process, or a combination of the foregoing.

Figure 19E:
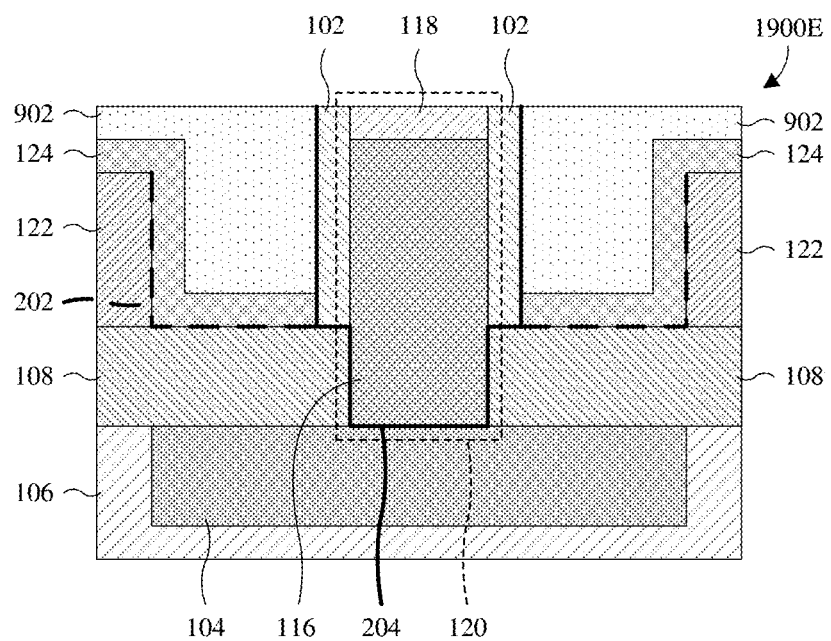

As illustrated by the cross-sectional view 1900E of FIG. 19E, a top surface of the barrier layer 102 is recessed to even with or below a top surface of the bump 120. In some embodiments, the recessing is performed by an etch back. In other embodiments, the recessing is performed by a planarization. For example, an additional sacrificial layer (not shown) may be formed filling a remainder of the second opening 204, and a planarization may be performed into the sacrificial layer, the additional sacrificial layer, and the barrier layer 102 until the additional sacrificial layer is removed and the bump 120 is reached. The planarization may, for example, be performed by a CMP.

Figure 19F:
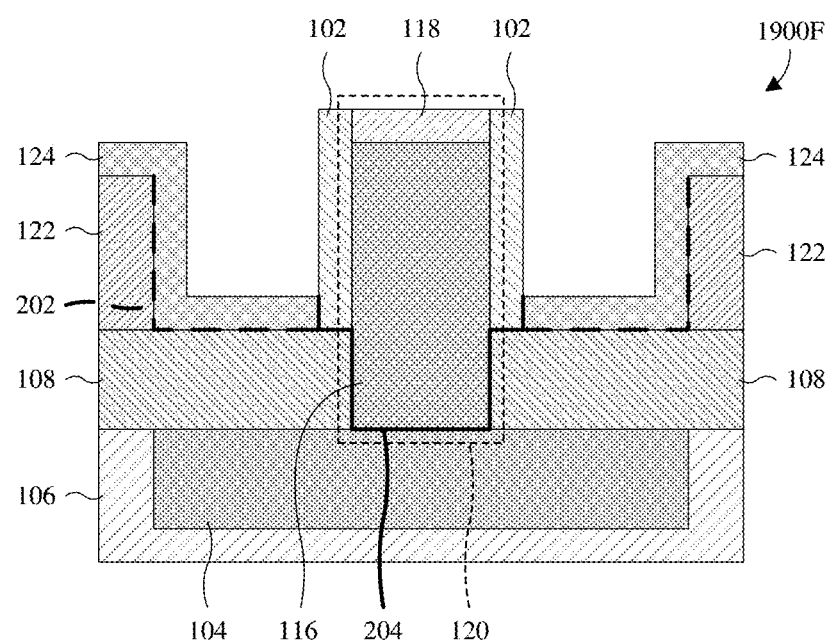

As illustrated by the cross-sectional view 1900F of FIG. 19F, a fourth etch is performed into the sacrificial layer 902 (see FIG. 19E) to remove the sacrificial layer 902. In some embodiments, the fourth etch stops on the etch stop layer 124.

Figure 20:
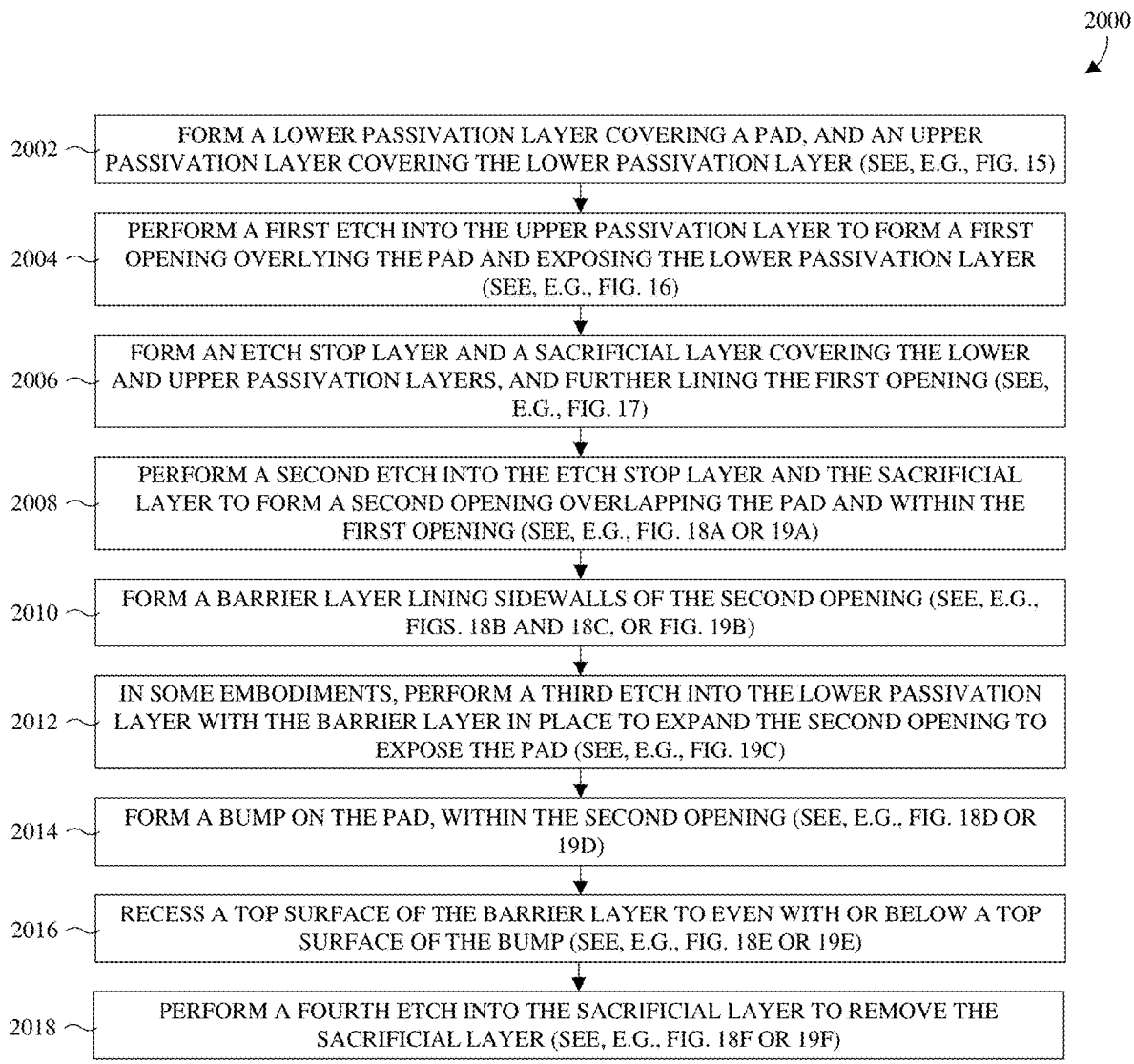
FIG. 20 illustrates a flowchart of some embodiments of the method of FIGS. 15-17, 18A-18F, and 19A-19F.

With reference to FIG. 20, a flowchart 2000 of some embodiments of the method of FIGS. 15-17, 18A-18F, and 19A-19F is provided.

At 2002, a lower passivation layer is formed covering a pad, and an upper passivation layer is formed covering the lower passivation layer. See, for example, FIG. 15.

At 2004, a first etch is performed into the upper passivation layer to form a first opening overlying the pad and exposing the lower passivation layer. See, for example, FIG. 16.

At 2006, an etch stop layer and a sacrificial layer are formed covering the lower and upper passivation layers, and further lining the first opening. See, for example, FIG. 17.

At 2008, a second etch is performed into the etch stop layer and the sacrificial layer to form a second opening overlying the pad and within the first opening. In some embodiments, the second etch is further into the lower passivation layer to form the second opening exposing the pad. In other embodiments, the second etch stops on the lower passivation layer. See, for example, FIG. 18A or 19A.

At 2010, a barrier layer is formed lining sidewalls of the second opening. See, for example, FIGS. 18B and 18C, or FIG. 19B.

At 2012, in embodiments where the second etch stops on the lower passivation layer, a third etch is performed into the lower passivation layer with the barrier layer in place to expand the second opening to expose the pad. See, for example, FIG. 19C.

At 2014, a bump is formed on the pad, within the second opening. See, for example, FIG. 18D or 19D.

At 2016, a top surface of the barrier layer is recessed to even with or below a top surface of the bump. See, for example, FIG. 18E or 19E.

At 2018, a fourth etch is performed into the sacrificial layer to remove the sacrificial layer. See, for example, FIG. 18F or 19F.

While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present provide an integrated circuit including: a conductive pad including a pad material; a conductive bump overlying the conductive pad, wherein the conductive bump includes a first bump layer and a second bump layer covering the first bump layer; and a barrier layer configured to block movement of the pad material from the conductive pad to the second bump layer along sidewalls of the first bump layer. In an embodiment, the barrier layer is between the conductive bump and the conductive pad, wherein the barrier layer extends laterally from a first sidewall of the barrier layer to a second sidewall of the barrier layer, and wherein the conductive bump is laterally spaced between the first and second sidewalls of the barrier layer. In an embodiment, the barrier layer cups an underside of the conductive bump. In an embodiment, the integrated circuit further includes a first seed layer covers the barrier layer, between the barrier layer and the conductive bump, wherein the first seed layer extends laterally from a first sidewall of the first seed layer to a second sidewall of the first seed layer, and wherein the conductive bump is laterally spaced between the first and second sidewalls of the first seed layer. In an embodiment, the integrated circuit further includes a second seed layer overlying the first seed layer, directly between the first seed layer and the conductive bump, wherein the second seed layer is laterally spaced between the first and second sidewalls of the first seed layer. In an embodiment, the conductive pad includes copper, wherein the second bump layer includes gold, wherein the first bump layer includes nickel, wherein the second seed layer includes cobalt, wherein the first seed layer includes tantalum or titanium, and wherein the barrier layer includes tantalum nitride. In an embodiment, the integrated circuit further includes a seed layer overlying the barrier layer, directly between the barrier layer and the conductive bump, wherein the seed layer has sidewalls respectively aligned with the sidewalls of the first bump layer. In an embodiment, the barrier layer is a spacer devoid of horizontal segments, wherein the barrier layer lines the sidewalls of the first bump layer. In an embodiment, the barrier layer has a bottom surface even with a bottom surface of the first bump layer. In an embodiment, the barrier layer includes titanium nitride, wherein the conductive pad includes copper, wherein the first bump layer includes nickel, and wherein the second bump layer includes gold. In an embodiment, the integrated circuit further includes: a semiconductor substrate; a semiconductor device layer overlying the semiconductor substrate and recessed into a top of the semiconductor substrate; and a BEOL metallization stack covering semiconductor substrate and the semiconductor device layer, wherein the BEOL metallization stack includes a plurality of vias alternatingly stacked with a plurality of wires, and wherein the vias and the wires define a conductive path electrically coupling the semiconductor device layer to the conductive pad. In an embodiment, the conductive bump has a cylindrical shape or a rectangular cuboid shape.

Some embodiments of the present provide a method for manufacturing an integrated circuit, the method including: forming a passivation layer covering a conductive pad, wherein the conductive pad includes a pad material; performing a first etch into the passivation layer to form a first opening exposing the conductive pad; forming a barrier layer lining the first opening, wherein the barrier layer is configured to block diffusion of the pad material through the barrier layer; forming a sacrificial layer covering the passivation layer, the conductive pad, and the barrier layer; performing a second etch into the sacrificial layer to form a second opening overlying the conductive pad and laterally spaced between sidewalls of the first opening; forming a conductive bump overlying the conductive pad, within the second opening, wherein the conductive bump includes a first bump layer and a second bump layer covering the first bump layer; and performing a third etch into the sacrificial layer to remove the sacrificial layer. In an embodiment, the barrier layer is continuous and is formed contacting sidewalls of the first opening, contacting the conductive pad, and overlying the passivation layer. In an embodiment, the method further includes: forming a first seed layer covering the barrier layer; and forming a second seed layer in the second opening, wherein the forming of the second seed layer includes selectively depositing the first seed layer on the first seed layer by a plating process, and wherein the conductive bump is formed directly on the second seed layer. In an embodiment, the forming of the conductive bump includes selectively depositing the first bump layer on the second seed layer by a plating process, and further includes selectively depositing the second bump layer on the first bump layer by a plating process.

Some embodiments of the present provide another method for manufacturing an integrated circuit, the method including: forming a first passivation layer covering a conductive pad, wherein the conductive pad comprises a pad material; forming a second passivation layer covering the first passivation layer; performing a first etch into the second passivation layer to form a first opening overlying the conductive pad and exposing the first passivation layer; forming a sacrificial layer filling the first opening, and further covering the first and second passivation layers; performing a second etch into the sacrificial layer to form a second opening overlying the conductive pad and laterally spaced between sidewalls of the first opening; forming a barrier layer lining sidewalls of the second opening and devoid of horizontal segments, wherein the barrier layer includes a pair of barrier segments on opposite sidewalls of the second opening, and wherein the barrier layer is configured to block diffusion of the pad material through the barrier layer; forming a conductive bump within the second opening and directly between the barrier segments, wherein the conductive bump comprises a first bump layer and a second bump layer covering the first bump layer; and performing a third etch into the sacrificial layer to remove the sacrificial layer. In an embodiment, the forming of the sacrificial layer includes: forming the sacrificial layer covering the sacrificial layer and lining the second opening; and performing a fourth etch into the sacrificial layer to remove horizontal segments of the sacrificial layer without removing vertical segments of the sacrificial layer. In an embodiment, the method further includes performing a fifth etch into the first passivation layer with the sacrificial layer in place to expand the second opening to the conductive pad, wherein the second opening has a stepped profile, and wherein the conductive bump is formed after expanding the second opening. In an embodiment, the second etch is further performed into the first passivation layer, such that the second opening exposes the conductive pad.

In view of the foregoing, some embodiments of the present provide another integrated circuit including: a conductive pad including a pad material; a first passivation layer overlying the conductive pad and defining a first opening overlying the conductive pad, wherein the first opening is laterally spaced between sidewalls of the conductive pad; a barrier layer overlying the first passivation layer and lining the first opening; a seed layer overlying the barrier layer within the first opening; and a conductive bump overlying the seed layer and the conductive pad, wherein the conductive bump is laterally spaced between sidewalls of the first opening, wherein the conductive bump includes a first bump layer and a second bump layer covering the first bump layer, and wherein the barrier layer is configured to block movement of the pad material from the conductive pad to the second bump layer along sidewalls of the first bump layer. In an embodiment, the barrier layer cups an underside of the conductive bump and an underside of the seed layer. In an embodiment, the seed layer and the bump layer collectively have a rectangular profile. In an embodiment, the integrated circuit further includes an additional seed layer covering and contacting the barrier layer, wherein the additional seed layer overlies the first passivation layer and lines the first opening over the barrier layer, wherein the seed layer overlies and contacts the additional seed layer, and wherein the seed layer is spaced between the sidewalls of the first opening.

In view of the foregoing, some embodiments of the present provide yet another integrated circuit including: a conductive pad including a pad material; a first passivation layer overlying the conductive pad and defining a first opening exposing the conductive pad, wherein the first opening is laterally spaced between sidewalls of the conductive pad; a second passivation layer overlying the first passivation layer and defining a second opening overlying first opening, wherein the first opening is laterally spaced between sidewalls of the second opening; a conductive bump overlying the conductive pad, within the first and second openings, wherein the conductive bump is laterally spaced between the sidewalls of the second opening, and wherein the conductive bump includes a first bump layer and a second bump layer covering the first bump layer; and a barrier layer lining sidewalls of the first bump layer, wherein the barrier layer includes a pair of barrier segments on opposite sidewalls of the first bump layer, wherein the barrier layer is devoid of horizontal segments, and wherein the barrier layer is configured to block movement of the pad material from the conductive pad to the second bump layer along the sidewalls of the first bump layer. In an embodiment, a bottom surface of the barrier layer is even with a bottom surface of the first bump layer. In an embodiment, the first bump layer contacts the conductive pad, wherein the second bump layer contacts the first bump layer. In an embodiment, the barrier layer overlies the first passivation layer, wherein a bottom surface of the barrier layer is spaced over a bottom surface of the first bump layer. In an embodiment, the barrier layer and the first bump layer contact the conductive pad, wherein the second bump layer contacts the first bump layer.

Some embodiments of the present provide yet another method for manufacturing an integrated circuit, the method including: forming a sacrificial layer overlying a conductive pad, wherein the conductive pad includes a pad material; performing a first etch into the sacrificial layer to form an opening overlying the conductive pad, wherein the opening is laterally spaced between sidewalls of the conductive pad; forming a conductive bump overlying the conductive pad and within the opening, wherein the conductive bump includes a first bump layer and a second bump layer covering the first bump layer; and forming a barrier layer configured to block movement of the pad material from the conductive pad to the second bump layer along the sidewalls of the first bump layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a conductive pad comprising a pad material;
a dielectric structure overlying the conductive pad;
a metal bump that extends through the dielectric structure from the conductive pad and is devoid of copper, wherein the metal bump comprises a first metal layer and a second metal layer that respectively comprise different metals, wherein the second metal layer overlies the first metal layer and is at a topmost surface of the metal bump, and wherein a width of the metal bump is continuous from the conductive pad to the topmost surface;
a conductive spacer having a pair of spacer segments, wherein the metal bump is between and directly contacts the spacer segments, wherein the spacer segments are between and directly contact opposing sidewalls of the dielectric structure, and wherein the conductive spacer is configured to block movement of the pad material from the conductive pad to the second metal layer; and
an etch stop layer that is dielectric and has a U-shaped portion sunken into a top of the dielectric structure, wherein the U-shaped portion has opposing sidewalls at a bottom surface of the U-shaped portion and between which the spacer segments are arranged.

2. The integrated circuit according to claim 1, wherein the top of the dielectric structure has a recess within which the metal bump is arranged, wherein the metal bump extends through a recessed surface of the dielectric structure that is in the recess and that is recessed relative to a top surface of the dielectric structure, and wherein the recessed surface is spaced over the conductive pad.

3. The integrated circuit according to claim 2, wherein the conductive spacer is spaced from a sidewall of the recess that is defined by the dielectric structure.

4. The integrated circuit according to claim 1, wherein the conductive spacer extends through the dielectric structure to the conductive pad.

5. The integrated circuit according to claim 1, wherein the metal bump consists essentially of the first metal layer and the second metal layer, and wherein the first and second metal layers respectively comprise nickel and gold.

6. The integrated circuit according to claim 1, wherein the bottom surface of the U-shaped portion and an outer sidewall of the U-shaped portion directly contact the dielectric structure, and wherein the spacer segments directly contact the opposing sidewalls of the U-shaped portion, which are laterally offset from the outer sidewall.

7. The integrated circuit according to claim 1, wherein the opposing sidewalls of the U-shaped portion respectively overlie, and are edge to edge respectively with, the opposing sidewalls of the dielectric structure, and wherein the spacer segments are between and directly contact the opposing sidewalls of the U-shaped portion.

8. The integrated circuit according to claim 1, wherein the width of the metal bump is constant from the conductive pad to the topmost surface, and wherein the opposing sidewalls of the dielectric structure have bottom edges directly contacting the conductive pad.

9. An integrated circuit comprising:
a conductive pad comprising a pad material;
a first passivation layer overlying the conductive pad, wherein the first passivation layer has a first passivation sidewall;
a second passivation layer overlying the first passivation layer, wherein the second passivation layer has a second passivation sidewall;
a conductive bump extending through the first and second passivation layers from the conductive pad, wherein the conductive bump comprises a first bump layer and a second bump layer covering the first bump layer, wherein the first and second bump layers define a first common sidewall, wherein the first passivation sidewall is laterally separated from the first common sidewall by a first distance, wherein the second passivation sidewall is laterally separated from the first common sidewall by a second distance greater than the first distance, and wherein the first and second passivation sidewalls are on a common side of the conductive bump;

a conductive spacer on the first common sidewall and spaced from the second passivation sidewall, wherein the conductive spacer is configured to block diffusion of the pad material along the first common sidewall; and an etch stop layer overlying the first and second passivation layers, wherein the etch stop layer is on the second passivation sidewall and wraps around a top corner of the second passivation layer at the second passivation sidewall, wherein the etch stop layer and the first passivation layer define a second common sidewall at the first passivation sidewall, and wherein the conductive spacer is between and directly contacts the first and second common sidewalls.

10. The integrated circuit according to claim 9, wherein the pad material comprises copper, and wherein the conductive spacer comprises titanium nitride.

11. The integrated circuit according to claim 9, wherein the conductive spacer has a line-shaped segment directly contacting the first common sidewall.

12. The integrated circuit according to claim 11, wherein the line-shaped segment is on a sidewall of the first bump layer and a sidewall of the second bump layer.

13. An integrated circuit comprising:
a metal pad comprising copper;
a first dielectric film overlying the metal pad and having a pair of first sidewall segments respectively on opposite sides of the metal pad;
a second dielectric film overlying the first dielectric film and having a pair of second sidewall segments respectively on the opposite sides of the metal pad;
a bump structure extending through the first and second dielectric films from the metal pad, wherein the bump structure comprises a nickel layer and a gold layer that are stacked and share a common width;
a metal nitride spacer having a pair of spacer segments between which the bump structure is sandwiched, wherein the spacer segments are respectively at the first sidewall segments; and
an etch stop layer overlying the first and second dielectric films, wherein the etch stop layer extends along and directly contacts a top surface of the first dielectric film continuously from direct contact with the second sidewall segments respectively to direct contact with the spacer segments;
wherein a first lateral distance from the first sidewall segments to the bump structure is less than a second lateral distance from the second sidewall segments to the bump structure.

14. The integrated circuit according to claim 13, wherein the metal nitride spacer directly contacts the nickel layer and the gold layer.

15. The integrated circuit according to claim 13, wherein a top surface of the bump structure is elevated relative to a top surface of the second dielectric film.

16. The integrated circuit according to claim 13, wherein the metal nitride spacer overlies the first dielectric film.

17. The integrated circuit according to claim 13, wherein the metal nitride spacer extends through the first and second dielectric films from the metal pad.

18. The integrated circuit according to claim 13,
wherein the etch stop layer has a U-shaped portion, wherein the U-shaped portion extends through the second dielectric film to the first dielectric film, and wherein the bump structure extends through the U-shaped portion.

19. The integrated circuit according to claim 13, wherein bottom edges of the second sidewall segments directly contact the top surface of the first dielectric film, wherein the etch stop layer extends along the second sidewall segments from a top surface of the second dielectric film to the top surface of the first dielectric film, and further extends from direct contact with the bottom edges respectively to direct contact with the spacer segments.

20. The integrated circuit according to claim 13, wherein the etch stop layer has a pair of third sidewall segments respectively on the opposite sides of the metal pad, wherein the third sidewall segments respectively and directly contact the spacer segments, and wherein the third sidewall segments respectively overlie, and are edge to edge respectively with, the first sidewall segments.

\* \* \* \* \*